US012624988B2

(12) United States Patent
Shimatani et al.

(10) Patent No.: US 12,624,988 B2
(45) Date of Patent: May 12, 2026

(54) ELECTROMAGNETIC WAVE DETECTOR AND ELECTROMAGNETIC WAVE DETECTOR ARRAY

(71) Applicant: Mitsubishi Electric Corporation, Tokyo (JP)

(72) Inventors: Masaaki Shimatani, Tokyo (JP); Shimpei Ogawa, Tokyo (JP); Shoichiro Fukushima, Tokyo (JP); Satoshi Okuda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 267 days.

(21) Appl. No.: 18/028,764

(22) PCT Filed: Aug. 24, 2021

(86) PCT No.: PCT/JP2021/030923
§ 371 (c)(1),
(2) Date: Mar. 28, 2023

(87) PCT Pub. No.: WO2022/091537
PCT Pub. Date: May 5, 2022

(65) Prior Publication Data
US 2023/0332942 A1     Oct. 19, 2023

(30) Foreign Application Priority Data

Oct. 26, 2020     (JP) ................................. 2020-178997

(51) Int. Cl.
*G01J 1/02*          (2006.01)
*G01R 31/12*          (2020.01)
*H10F 77/16*          (2025.01)

(52) U.S. Cl.
CPC .......... *G01J 1/0295* (2013.01); *G01R 31/129* (2013.01); *H10F 77/16* (2025.01)

(58) Field of Classification Search
CPC ....... G01R 31/129; G01J 1/0295; H10F 77/16
See application file for complete search history.

(56) References Cited

U.S. PATENT DOCUMENTS

2015/0243826 A1     8/2015   An et al.
2015/0333196 A1*   11/2015   Shin ........................ H10F 30/00
                                                                    257/29
(Continued)

FOREIGN PATENT DOCUMENTS

JP          2016-025356 A        2/2016
JP          2019-002852 A        1/2019
(Continued)

OTHER PUBLICATIONS

Shimatani et al., "High-responsivity turbostratic stacked graphene photodetectors using enhanced photogating", Applied Physics Express 12, 122010 (2019). (Year: 2019).*
(Continued)

*Primary Examiner* — Tae-Sik Kang
(74) *Attorney, Agent, or Firm* — XSENSUS LLP

(57)          ABSTRACT

An electromagnetic wave detector includes a semiconductor layer, a two-dimensional material layer, a first electrode portion, a second electrode portion, and a ferroelectric layer. Two-dimensional material layer is electrically connected to semiconductor layer. First electrode portion is electrically connected to two-dimensional material layer. Second electrode portion is electrically connected to two-dimensional material layer with semiconductor layer interposed therebetween. Ferroelectric layer is electrically connected to at least any one of first electrode portion, second electrode portion and semiconductor layer. Electromagnetic wave detector is configured such that an electric field generated from ferroelectric layer is shielded with respect to two-dimensional material layer. Alternatively, ferroelectric layer is arranged (Continued)

so as not to be overlapped with two-dimensional material layer in plan view.

23 Claims, 39 Drawing Sheets

(56)                    References Cited

U.S. PATENT DOCUMENTS

| | | |
|---|---|---|
| 2016/0020280 A1 | 1/2016 | Heo et al. |
| 2019/0252569 A1 | 8/2019 | Jo et al. |
| 2021/0020797 A1 | 1/2021 | Fukushima et al. |
| 2021/0210643 A1 | 7/2021 | Shimatani et al. |
| 2022/0197107 A1 | 6/2022 | Ogawa et al. |

FOREIGN PATENT DOCUMENTS

| | | |
|---|---|---|
| JP | 6766277 B | 9/2020 |
| WO | 2020/003564 A | 1/2020 |
| WO | 2020/003613 A1 | 1/2020 |

OTHER PUBLICATIONS

Japanese Notification of Reasons for Refusal issued Mar. 7, 2023 in corresponding Japanese Patent Application No. 2022-076495 (with English translation), 18 pages.
International Search Report and Written Opinion mailed on Nov. 22, 2021, received for PCT Application PCT/JP2021/030923, filed on Aug. 24, 2021, 10 pages including English Translation.
Notice of Reasons for Refusal mailed on Mar. 8, 2022, received for JP Application 2022-505342, 12 pages including English Translation.

* cited by examiner

FIG.21

ELECTROMAGNETIC WAVE DETECTOR AND ELECTROMAGNETIC WAVE DETECTOR ARRAY

CROSS-REFERENCE TO RELATED APPLICATIONS

The present application is based on PCT filing PCT/JP2021/030923, filed Aug. 24, 2021, which claims priority to JP 2020-178997, filed Oct. 26, 2020, the entire contents of each are incorporated herein by reference.

TECHNICAL FIELD

The present disclosure relates to an electromagnetic wave detector and an electromagnetic wave detector array.

BACKGROUND ART

As a material of an electromagnetic wave detecting layer for use in a next-generation electromagnetic wave detector, graphene which is one example of a two-dimensional material layer is known. Graphene has very high mobility. Absorptance of graphene is as low as 2.3%. For this reason, a technique of enhancing the sensitivity in an electromagnetic wave detector in which graphene is used as a two-dimensional material layer has been proposed.

For example, U.S. Patent Application Publication 2015/0243826 (PTL 1) proposes a detector having the following structure. That, in U.S. Patent Application Publication 2015/0243826, two or more dielectric layers are disposed on the n-type semiconductor layer. A graphene layer is formed on two dielectric layers, and on a surface part of an n-type semiconductor layer located between the two dielectric layers. Source and drain electrodes connected to both ends of the graphene layer are arranged on the dielectric layer. The gate electrode is connected to the n-type semiconductor layer.

In the aforementioned detector, voltage is applied to the graphene layer serving as a channel via the source and drain electrodes. As a result, the photo carrier generated in the n-type semiconductor layer is amplified, and thus the sensitivity of the detector improves. When voltage is applied to the gate electrode, and the source electrode or the drain electrode, OFF operation is enabled by Schottky connection between graphene and the n-type semiconductor layer.

CITATION LIST

Patent Literature

PTL 1: U.S. Patent Application Publication 2015/0243826

SUMMARY OF INVENTION

Technical Problem

In the detector described in the above publication (electromagnetic wave detector), an electromagnetic wave is detected by a photo carrier generated by application of the electromagnetic wave to the semiconductor layer. Therefore, the sensitivity of the detector depends on the quantum efficiency of the semiconductor layer. The quantum efficiency of the semiconductor layer is not sufficiently high depending on the wavelength of the electromagnetic wave. Therefore, the detection sensitivity of the electromagnetic wave detector is insufficient.

The present disclosure was made in light of the above problems, and it is an object of the present disclosure to provide an electromagnetic wave detector and an electromagnetic wave detector array capable of improving the sensitivity.

Solution to Problem

An electromagnetic wave detector of the present disclosure includes a semiconductor layer, a two-dimensional material layer, a first electrode portion, a second electrode portion, and a ferroelectric layer. The two-dimensional material layer is electrically connected to the semiconductor layer. The first electrode portion is electrically connected to the two-dimensional material layer. The second electrode portion is electrically connected to the two-dimensional material layer with the semiconductor layer interposed therebetween. The ferroelectric layer is electrically connected to at least any one of the first electrode portion, the second electrode portion, and the semiconductor layer. The electromagnetic wave detector is configured such that the electric field generated from the ferroelectric layer is shielded with respect to the two-dimensional material layer. Alternatively, the ferroelectric layer is arranged so as not to be overlapped with the two-dimensional material layer in plan view.

Advantageous Effects of Invention

According to the electromagnetic wave detector of the present disclosure, the ferroelectric layer is electrically connected to at least any one of the first electrode portion, the second electrode portion, and the semiconductor layer. The pyroelectric effect of the ferroelectric layer does not depend on the wavelength of the electromagnetic wave. Therefore, the sensitivity of the electromagnetic wave detector does not depend on the quantum efficiency of the semiconductor layer. Therefore, even for a wavelength for which the quantum efficiency of the semiconductor layer decreases, deterioration in sensitivity of the electromagnetic wave detector is suppressed. Therefore, the sensitivity of the electromagnetic wave detector improves.

BRIEF DESCRIPTION OF DRAWINGS

FIG. 21 is a section view schematically showing a configuration of the electromagnetic wave detector according to Embodiment 7.

DESCRIPTION OF EMBODIMENTS

Figure 1:
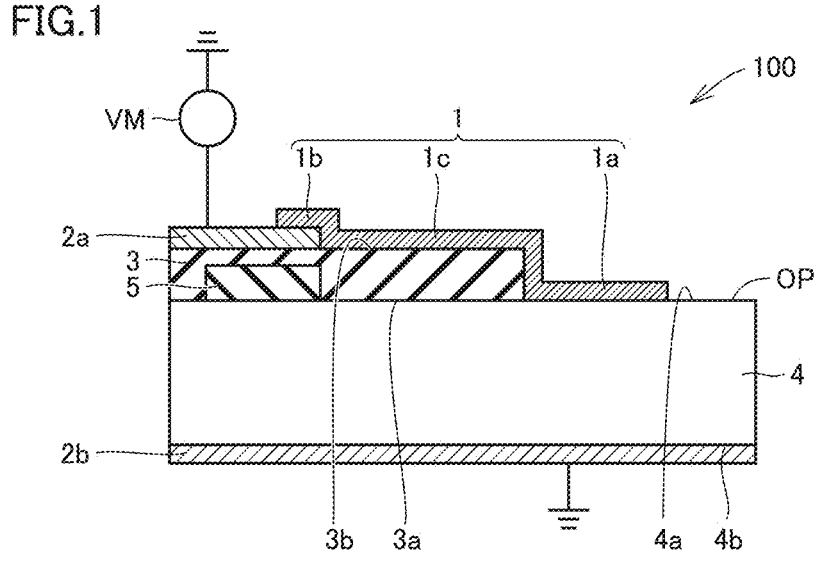
FIG. 1 is a section view schematically showing a configuration of an electromagnetic wave detector according to Embodiment 1.

Hereinafter, embodiments are described with reference to the drawings. In the following, the same or the corresponding part is denoted by the same reference numeral and overlapping description is not repeated.

In the embodiments described below, the drawings are schematic, and conceptually illustrate the functions or structures. The embodiments described below will not restrict the present disclosure. The basic structure of the electromagnetic wave detector is common among all of the embodiments unless otherwise noted. The one denoted by the same reference numeral corresponds to the same object or a corresponding object as described above. This applies in the entirety of the description.

In the embodiments described below, configuration of an electromagnetic wave detector in the case of detecting visible light or infrared light is described, however, the light to be detected by the electromagnetic wave detector of the present disclosure is not limited to visible light and infrared light. The embodiments described below are effective as detectors that detect, for example, X-ray, ultraviolet light, far red light, terahertz (THz) wave, radio waves such as microwave, as well as visible light and infrared light. In the embodiments of the present disclosure, these light and radio waves are collectively referred to as an electromagnetic wave.

Also, in the present embodiments, graphene can be described by the terms of p-type graphene and n-type graphene. In the following embodiments, the graphene having more holes than intrinsic graphene is called p-type graphene, and the graphene having more electrons than intrinsic graphene is called n-type graphene. That is, the n-type material is a material having electron-donating nature. Also, the p-type material is a material having electron-withdrawing nature.

Also, when polarization is observed in electric charges in the entire molecule, the one in which electrons are dominant is sometimes called n-type. When polarization is observed in electric charges in the entire molecule, the one in which holes are dominant is sometimes called p-type. As a material of the member that comes into contact with graphene which is one example of the two-dimensional material layer, one of an organic substance or an inorganic substance, or a mixture of an organic substance and an inorganic substance may be used.

Regarding plasmon resonance phenomena such as a surface plasmon resonance phenomenon that is the interaction between the metal surface and the light, a phenomenon called a pseudo surface plasmon resonance phenomenon in the meaning of resonance concerning metal surface outside the visible light range and near-infrared range, or a phenomenon called a metamaterial or a plasmonic metamaterial in the meaning of manipulating the wavelength by a structure having a dimension of less than or equal to the wavelength, these are not particularly distinguished from each other according to the names, but are equally handled from the aspect the effect exerted by the phenomenon. Here, these resonances are called, surface plasmon resonance, plasmon resonance, or simply resonance.

In the embodiments described below, description is made for graphene as an example of a material of the two-dimensional material layer, however, the material of the two-dimensional material layer is not limited to graphene. For example, as a material of the two-dimensional material layer, materials such as transition metal dichalcogenide (TMD), black phosphorus, silicene (two-dimensional honeycomb structure by silicon atoms), genmanene (two-dimensional honeycomb structure by germanium atoms) and the like are applicable. Examples of transition metal dichalcogenide include transition metal dichalcogenide such as molybdenum disulfide ($MoS_2$), tungsten disulfide ($WS_2$), tungsten diselenide ($WSe_2$) and the like.

More preferably, the two-dimensional material layer contains any one of materials selected from the group consisting of graphene, transition metal dichalcogenide (TMD), black phosphorus, silicene (two-dimensional honeycomb structure by silicon atoms), graphene nanoribbon, and borophene.

These materials have structures similar to those of graphene. In these materials, atoms are arranged by a monolayer in the two-dimensional surface. Therefore, when these materials are applied to the two-dimensional material layer, the operation and effect similar to those in the case of applying graphene to the two-dimensional material layer are obtained.

In the present embodiments, the object represented by insulating layer is a layer of an insulator having such a thickness that will not generate a tunnel current.

Embodiment 1

<Configuration of Electromagnetic Wave Detector 100>

Referring to FIGS. 1 to 6, a configuration of an electromagnetic wave detector 100 according to Embodiment 1 is described. FIG. 1 is a section view in the 1-1 line of FIG. 2.

As shown in FIG. 1, electromagnetic wave detector 100 includes a semiconductor layer 4, a two-dimensional material layer 1, a first electrode portion 2a, a second electrode portion 2b, and a ferroelectric layer 5. Two-dimensional material layer 1, first electrode portion 2a, second electrode portion 2b and semiconductor layer 4 are electrically connected in the order of first electrode portion 2a, two-dimensional material layer 1, semiconductor layer 4 and second electrode portion 2b. In the present embodiment, electromagnetic wave detector 100 further includes an insulating film 3. Also, electromagnetic wave detector 100 further includes at least one of a voltmeter VM and a later-described ammeter IM (see FIG. 5). Electromagnetic wave detector 100 shown in FIG. 1 further includes voltmeter VM.

As shown in FIG. 1, semiconductor layer 4 has a first surface 4a and a second surface 4b. Second surface 4b is opposed to first surface 4a. Two-dimensional material layer 1, first electrode portion 2a, insulating film 3 and ferroelectric layer 5 are arranged on first surface 4a side. Second electrode portion 2b is arranged on second surface 4b side. First surface 4a side is called a top surface side. Second surface 4b side is called a bottom surface side.

Two-dimensional material layer 1 is electrically connected to semiconductor layer 4. Two-dimensional material layer 1 is arranged on first electrode portion 2a, insulating film 3 and semiconductor layer 4. That is, two-dimensional material layer 1 is in contact with first electrode portion 2a, insulating film 3 and semiconductor layer 4.

Two-dimensional material layer 1 includes a first part 1a, a second part 1b and a third part 1c. First part 1a is arranged on semiconductor layer 4. First part 1a is electrically connected to semiconductor layer 4. Second part 1b is arranged on first electrode portion 2a. Second part 1b is electrically connected to first electrode portion 2a. Third part 1c is electrically connected to first part 1a and second part 1b. First part 1a and second part 1b are connected by third part 1c. In the present embodiment, third part 1c is arranged on insulating film 3.

Thicknesses of first part 1a, second part 1b and third part 1c may be mutually the same. Along the direction in which two-dimensional material layer 1 is overlaid on semiconductor layer 4, a distance between the surface of the top surface side of first part 1a and first surface 4a of semiconductor layer 4 is smaller than a distance between the surface of the top surface side of second part 1b and first surface 4a of semiconductor layer 4. Although not illustrated, on the surface of two-dimensional material layer 1, projections and recesses caused by first part 1a, second part 1b and third part 1c are formed.

First electrode portion 2a is electrically connected to two-dimensional material layer 1. First electrode portion 2a is electrically connected to two-dimensional material layer 1 without being interposed by semiconductor layer 4. In the present embodiment, first electrode portion 2a is directly connected to two-dimensional material layer 1. First electrode portion 2a is arranged on the bottom surface side of two-dimensional material layer 1. Although not illustrated, first electrode portion 2a may be arranged on the top surface side of two-dimensional material layer 1.

Second electrode portion 2b is electrically connected to two-dimensional material layer 1 with semiconductor layer 4 interposed therebetween. Second electrode portion 2b is in contact with semiconductor layer 4. In electromagnetic wave detector 100 shown in FIG. 1, second electrode portion 2b covers the entire surface of second surface 4b of semiconductor layer 4. Electromagnetic wave detector 100 in which second electrode portion 2b covers the entire surface of second surface 4b is suited for the case where an electromagnetic wave that is to be detected enters electromagnetic wave detector 100 only from first surface 4a side (top surface side). Also, the electromagnetic wave having entered electromagnetic wave detector 100 from first surface 4a side (top surface side) penetrates ferroelectric layer 5 and semiconductor layer 4, and is then reflected by second electrode portion 2b. The electromagnetic wave reflected by second electrode portion 2b again enters ferroelectric layer 5 from second surface 4b side (bottom surface side). Therefore, the electromagnetic wave enters ferroelectric layer 5 from each of first surface 4a side and second surface 4b side. As a result, the absorptivity of electromagnetic wave of ferroelectric layer 5 improves.

Although not illustrated, second electrode portion 2b need not cover the entire surface of semiconductor layer 4. That is, it is only required that second electrode portion 2b is in contact with part of semiconductor layer 4. For example, it is only required that second electrode portion 2b is in contact with part of any one of first surface 4a, second surface 4b and a side surface extending in the direction intersecting with first surface 4a and second surface 4b. When second surface 4b of semiconductor layer 4 is exposed from second electrode portion 2b, electromagnetic wave detector 100 is capable of detecting the electromagnetic wave entered from second surface 4b side.

Insulating film 3 is arranged on semiconductor layer 4. Insulating film 3 is arranged on a top surface side of semiconductor layer 4. In insulating film 3, an opening OP is formed. Opening OP penetrates insulating film 3. Semiconductor layer 4 is exposed from insulating film 3 in opening OP. That is, semiconductor layer 4 is not covered by insulating film 3 in opening OP. First surface 4a of semiconductor layer 4 is not covered by insulating film 3 in opening OP.

Two-dimensional material layer 1 is electrically connected to semiconductor layer 4 in opening OP. Two-dimensional material layer 1 extends from above opening OP to insulating film 3. In the present embodiment, two-dimensional material layer 1 extends from above opening OP to above insulating film 3. First part 1a of two-dimensional material layer 1 is arranged on first surface 4a of semiconductor layer 4 in opening OP. Preferably, two-dimensional material layer 1 is joined with semiconductor layer 4 by Schottky junction in opening OP. First part 1a of two-dimensional material layer 1 is joined with semiconductor layer 4 in opening OP. Insulating film 3 separates second part 1b and third part 1c of two-dimensional material layer 1 from semiconductor layer 4.

A first end of two-dimensional material layer 1 is arranged in opening OP. A second end of two-dimensional material layer 1 is arranged on second electrode portion 2b. The first end and the second end of two-dimensional material layer 1 are end parts in the longitudinal direction of two-dimensional material layer 1. In FIG. 1, the first end of two-dimensional material layer 1 is arranged on an opposite side of first electrode portion 2a with respect to the center of opening OP in the in-plane direction of semiconductor layer 4, and the second end of two-dimensional material layer 1 is arranged on first electrode portion 2a side with respect to the center of opening OP. Although not illustrated, each of the first end and the second end of two-dimensional material layer 1 may be arranged on first electrode portion 2a side with respect to the center of opening OP.

Also, in FIG. 1, two-dimensional material layer 1 is arranged such that part of first surface 4a of semiconductor layer 4 is exposed in opening OP. Although not illustrated, two-dimensional material layer 1 may be arranged to cover the entire surface of first surface 4a of semiconductor layer 4.

Insulating film 3 has a third surface 3a and a fourth surface 3b. Third surface 3a is in contact with first surface 4a of semiconductor layer 4. Fourth surface 3b is opposed to third surface 3a. At least part of fourth surface 3b is in contact with two-dimensional material layer 1. That is, insulating film 3 is arranged on the bottom surface side with respect to two-dimensional material layer 1. First electrode portion 2a is arranged on fourth surface 3b of insulating film 3. First electrode portion 2a is arranged at a position distanced from opening OP.

Ferroelectric layer 5 is electrically connected to at least any one of first electrode portion 2a, second electrode portion 2b and semiconductor layer 4. In the present embodiment, ferroelectric layer 5 is electrically connected to first electrode portion 2a, second electrode portion 2b and semiconductor layer 4. In FIG. 1, insulating film 3 is arranged on ferroelectric layer 5. That is, ferroelectric layer 5 is covered by insulating film 3. Ferroelectric layer 5 is arranged on semiconductor layer 4. Ferroelectric layer 5 is in contact with semiconductor layer 4. Ferroelectric layer 5 is arranged between first electrode portion 2a and semiconductor layer 4.

Ferroelectric layer 5 has sensitivity for a wavelength of electromagnetic wave (detection wavelength) that is an object to be detected by electromagnetic wave detector 100. Therefore, when an electromagnetic wave having a detection wavelength is applied to ferroelectric layer 5, polarization changes in ferroelectric layer 5. In other words, when an electromagnetic wave having a detection wavelength is applied to ferroelectric layer 5, pyroelectric effect is generated in ferroelectric layer 5. The direction in which polarization changes (polarization direction) is preferably the direction in which a photo carrier generated by polarization is injected into two-dimensional material layer 1. In the present embodiment, the direction in which an electromagnetic wave is applied to electromagnetic wave detector 100 is a direction in which first electrode portion 2a and second electrode portion 2b overlap (vertical direction on the paper surface).

In the present embodiment, ferroelectric layer 5 is arranged such that resistance between first electrode portion 2a and second electrode portion 2b changes when polarization in ferroelectric layer 5 changes. As a result, the electric field is generated along the direction in which first electrode portion 2a and second electrode portion 2b overlap (vertical direction on the paper surface).

Ferroelectric layer 5 is configured to inject a photo carrier generated in ferroelectric layer 5 into two-dimensional material layer 1. The wording "a photo carrier is injected into two-dimensional material layer 1" means that a photo carrier is injected into two-dimensional material layer 1 without being mediated by insulating film 3. The photo carrier generated from ferroelectric layer 5 is injected into two-dimensional material layer 1 through at least any one of first electrode portion 2a, second electrode portion 2b and semiconductor layer 4.

Preferably, ferroelectric layer 5 is arranged such that voltage in a forward bias direction is applied to two-dimensional material layer 1 and semiconductor layer 4. For example, when a p-type material is used in semiconductor layer 4, and an n-type material is used in the two-dimensional material layer, it is preferred that ferroelectric layer 5 is arranged such that holes are injected into first electrode portion 2a from ferroelectric layer 5 and electrons are injected into second electrode portion 2b from ferroelectric layer 5 by application of an electromagnetic wave. When an n-type material is used in semiconductor layer 4, and a p-type material is used in the two-dimensional material layer, it is preferred that ferroelectric layer 5 is arranged such that electrons are injected into first electrode portion 2a from ferroelectric layer 5 and holes are injected into second electrode portion 2b from ferroelectric layer 5 by application of an electromagnetic wave.

Ferroelectric layer 5 may be arranged such that voltage in a reverse bias direction is applied to two-dimensional material layer 1 and semiconductor layer 4. In this case, when reverse bias is applied, application of electromagnetic wave switches between the saturation region and the breakdown region of semiconductor layer 4, and thus the dark current is reduced.

Electromagnetic wave detector 100 is configured such that the electric field generated from ferroelectric layer 5 is shielded with respect to two-dimensional material layer 1. Alternatively, ferroelectric layer 5 is arranged so as not to be overlapped with two-dimensional material layer 1 in plan view.

In Embodiment 1, electromagnetic wave detector 100 is configured such that the electric field generated from ferroelectric layer 5 is shielded with respect to two-dimensional material layer 1. The electric field is shielded by a conductor. Therefore, the electric field generated by ferroelectric layer 5 is shielded by at least any one of first electrode portion 2a, second electrode portion 2b and semiconductor layer 4.

A part of ferroelectric layer 5 facing with two-dimensional material layer 1, and two-dimensional material layer 1 sandwich at least any one of first electrode portion 2a, second electrode portion 2b and semiconductor layer 4. Preferably, between the entire surface of a part of ferroelectric layer 5 facing with two-dimensional material layer 1, and two-dimensional material layer 1, at least any one of first electrode portion 2a, second electrode portion 2b and semiconductor layer 4 is sandwiched. In electromagnetic wave detector 100 shown in FIG. 1, a part of ferroelectric layer 5 facing with two-dimensional material layer 1, and two-dimensional material layer 1 sandwich first electrode portion 2a. Therefore, the electric field generated by ferroelectric layer 5 is shielded by first electrode portion 2a.

Preferably, ferroelectric layer 5 is not in contact with two-dimensional material layer 1. Contact resistance between two-dimensional material layer 1 and ferroelectric layer 5 is large. Therefore, if two-dimensional material layer 1 and ferroelectric layer 5 come into contact with each other, the electric field generated by change in polarization of ferroelectric layer 5 significantly changes the Fermi level of two-dimensional material layer 1, which may result in change in characteristics of electromagnetic wave detector 100.

The case where ferroelectric layer 5 is arranged so as not to be overlapped with two-dimensional material layer 1 in plan view is described in Embodiment 2.

Voltmeter VM is electrically connected between first electrode portion 2a and second electrode portion 2b. Voltmeter VM is voltmeter VM for detecting change in voltage generated by application of an electromagnetic wave to electromagnetic wave detector 100. Electromagnetic wave detector 100 is configured to detect an electromagnetic wave by detecting change in voltage of a current flowing between first electrode portion 2a and second electrode portion 2b by voltmeter VM.

Figure 2:
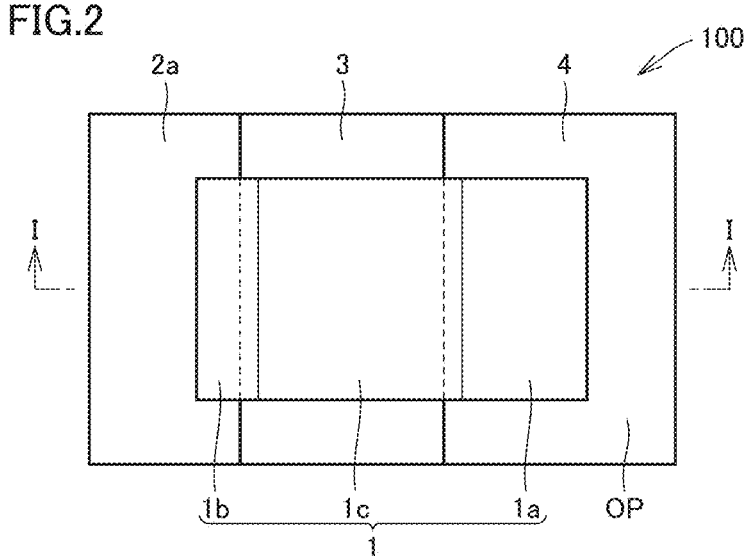
FIG. 2 is a top view schematically showing a configuration of the electromagnetic wave detector according to Embodiment 1.

As shown in FIG. 2, the shape in plan view of an end part of two-dimensional material layer 1 is a rectangular shape. The shape of an end part of two-dimensional material layer 1 is not limited to a rectangular shape, and may be a triangular shape, a comb shape and the like. Although not illustrated, when the shape of an end part of two-dimensional material layer 1 is a comb shape, first part 1a may have a plurality of end parts that are electrically connected to a semiconductor. In FIG. 2, the entire end part of two-dimensional material layer 1 is in contact with semiconductor layer 4. Therefore, the entire end part of two-dimensional material layer 1 is configured as first part 1a. Although not illustrated, a part of an end part of two-dimensional material layer 1 may be in contact with semiconductor layer 4, and the other part of an end part of two-dimensional material layer 1 may be in contact with insulating film 3. That is, a part of an end part of two-dimensional material layer 1 may be configured as first part 1a, and the other part of an end part of two-dimensional material layer 1 may be configured as third part c.

Figure 3:
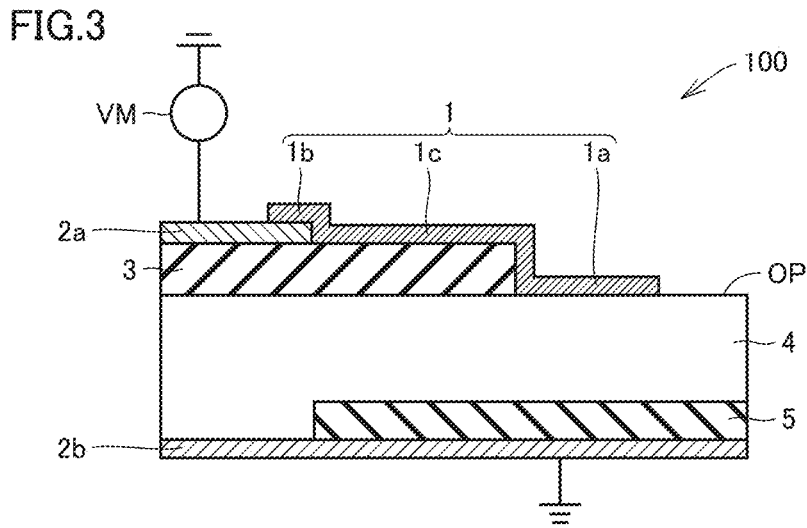
FIG. 3 is a section view schematically showing a configuration of an electromagnetic wave detector according to a first modified example of Embodiment 1.

As shown in FIG. 3, ferroelectric layer 5 may be arranged on second electrode portion 2b. Ferroelectric layer 5 is sandwiched between second electrode portion 2b and semiconductor layer 4. A part of ferroelectric layer 5 facing with two-dimensional material layer 1, and two-dimensional material layer 1 sandwich semiconductor layer 4. Therefore, the electric field generated by ferroelectric layer 5 is shielded by semiconductor layer 4. When the electric field is shielded by semiconductor layer 4, it is desired that semiconductor layer 4 has high concentration. Also, when the electric field is shielded by semiconductor layer 4, it is desired that semiconductor layer 4 has high conductivity. Also, when the electric field is shielded by semiconductor layer 4, it is desired that semiconductor layer 4 has large thickness.

Figure 4:
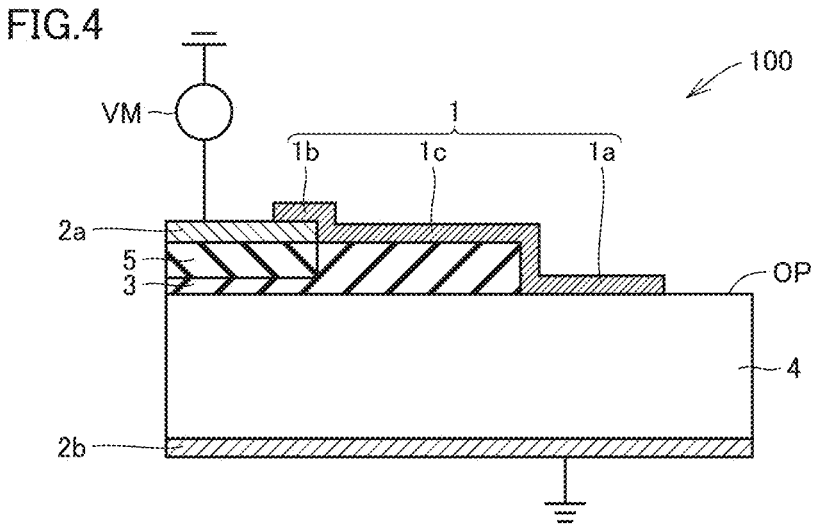
FIG. 4 is a section view schematically showing a configuration of an electromagnetic wave detector according to a second modified example of Embodiment 1.

As shown in FIG. 4, ferroelectric layer 5 may be directly connected to two-dimensional material layer 1 on the side opposite to two-dimensional material layer 1 with respect to first electrode portion 2a. A part of ferroelectric layer 5 facing with two-dimensional material layer 1, and two-dimensional material layer 1 sandwich first electrode portion 2a. The electric field generated by ferroelectric layer 5 is shielded by first electrode portion 2a.

Figure 5:
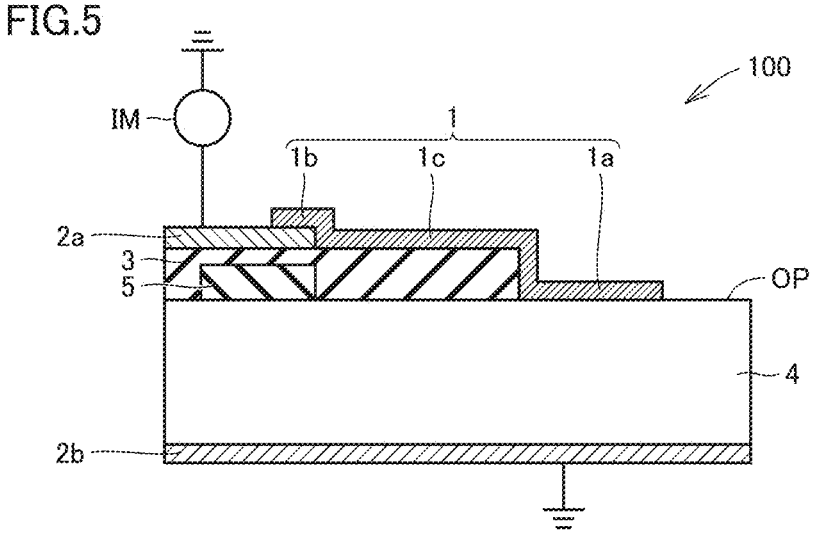
FIG. 5 is a section view schematically showing a configuration of an electromagnetic wave detector according to a third modified example of Embodiment 1.

As shown in FIG. 5, electromagnetic wave detector 100 may further include ammeter IM. Ammeter IM is electrically connected between first electrode portion 2a and second electrode portion 2b. Ammeter IM is ammeter IM for detecting change in current generated by application of an electromagnetic wave to electromagnetic wave detector 100. Electromagnetic wave detector 100 is configured to detect an electromagnetic wave by detecting change in current flowing between first electrode portion 2a and second electrode portion 2b by ammeter IM.

Figure 6:
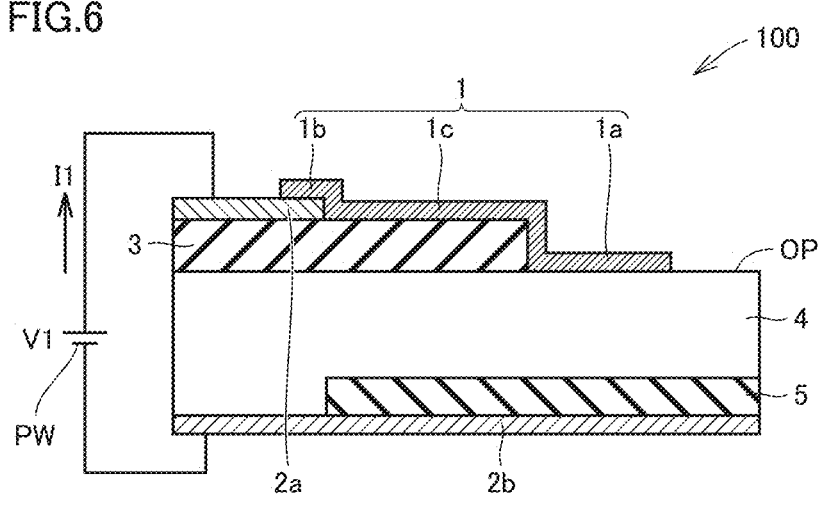
FIG. 6 is a section view schematically showing a configuration of an electromagnetic wave detector according to a fourth modified example of Embodiment 1.

As shown in FIG. 6, electromagnetic wave detector 100 may further include a power source PW. Power source PW is electrically connected to first electrode portion 2a and second electrode portion 2b. Power source PW is configured to apply voltage V1 to first electrode portion 2a and second electrode portion 2b. As a result, current I1 flows between first electrode portion 2a and second electrode portion 2b.

Next, configurations of two-dimensional material layer 1, first electrode portion 2a, second electrode portion 2b, insulating film 3, semiconductor layer 4 and ferroelectric layer 5 will be specifically described.

<Configuration of Two-Dimensional Material Layer 1>

Two-dimensional material layer 1 is, for example, monolayer graphene. Monolayer graphene is a monoatomic layer of two-dimensional carbon crystal. Graphene has a plurality of carbon atoms that are arranged in each of a plurality of chains arranged in a hexagonal form. Absorptance of graphene is as low as 2.3%. Specifically, absorptance of white light of graphene is 2.3%. In the present embodiment, the white light is light in which light having visible light wavelengths are evenly mixed. Two-dimensional material layer 1 may be multilayer graphene in which a plurality of graphene layers are laminated. The orientations of lattice vector of hexagonal lattices of graphene in multilayer graphene may be coincident or different from each other. The orientations of lattice vector of hexagonal lattices of graphene in multilayer graphene may be perfectly coincident. Two-dimensional material layer 1 may be graphene doped with a p-type or n-type impurity.

For example, by lamination of two or more layers of graphene layers, a band gap is formed in two-dimensional material layer 1. In other words, by varying the number of multilayer graphene layers, it is possible to adjust the size of the band gap. As a result, two-dimensional material layer 1 is capable of having a wavelength selective effect that selects an electromagnetic wave (detection wavelength) that is a target for photoelectric conversion. Also, for example, as the number of graphene layers of multilayer graphene increases, the mobility in the channel region deteriorates. On the other hand, as the number of graphene layers of multilayer graphene increases, the influence of photo carrier scattering from the substrate is suppressed, so that the noise of electromagnetic wave detector 100 decreases. Therefore, in electromagnetic wave detector 100 having two-dimensional material layer 1 in which multilayer graphene is used, light absorption is increased, and hence the detection sensitivity of electromagnetic wave improves.

As two-dimensional material layer 1, nanoribbon-like graphene (graphene nanoribbon) may be used. Two-dimensional material layer 1 may be sole graphene nanoribbon. The structure of two-dimensional material layer 1 may be such a structure that a plurality of graphene nanoribbons are laminated. The structure of two-dimensional material layer 1 may be such a structure that graphene nanoribbons are periodically arranged on a plane. In the case where two-dimensional material layer 1 has such a structure that graphene nanoribbons are periodically arranged, plasmon resonance is generated in the graphene nanoribbons, and hence the sensitivity of electromagnetic wave detector 100 improves. The structure in which graphene nanoribbons are periodically arranged is also called graphene metamaterial. In other words, the above-described effect is obtained in electromagnetic wave detector 100 in which graphene metamaterial is used as two-dimensional material layer 1.

An end part of two-dimensional material layer 1 may be graphene nanoribbon. In this case, Schottky junction is formed in the joining region between graphene nanoribbon and the semiconductor part because the graphene nanoribbon has a bandgap.

By contact of second part 1b of two-dimensional material layer 1 with first electrode portion 2a, the photo carrier is doped from first electrode portion 2a to two-dimensional material layer 1. For example, when two-dimensional material layer 1 is graphene, and first electrode portion 2a is gold (Au), the photo carrier is a hole. By the difference between the work function of graphene and the work function of gold (Au), holes are doped to second part 1b that is in contact with first electrode portion 2a. When electromagnetic wave detector 100 operates in an electron conductive state while second part 1b is doped with holes, the mobility of electrons flowing in the channel deteriorates by the influence of the holes. Therefore, the contact resistance between two-dimensional material layer 1 and first electrode portion 2a increases. In particular, when all regions in two-dimensional material layer 1 are formed of monolayer graphene, the amount of photo carrier (dope amount) introduced from first electrode portion 2a into two-dimensional material layer 1 is large. Therefore, deterioration in mobility of the field effect of electromagnetic wave detector 100 is significant. Therefore, when all regions of two-dimensional material layer 1 are formed of monolayer graphene, the performance of electromagnetic wave detector 100 deteriorates.

Also, the amount of photo carrier doped to multilayer graphene from first electrode portion 2a is smaller than the amount of photo carrier doped to monolayer graphene from first electrode portion 2a. Therefore, since first part 1a and second part 1b where the photo carrier is easy to be doped are formed of multilayer graphene, it is possible to suppress the increase in the contact resistance between two-dimensional material layer 1 and first electrode portion 2a. This makes it possible to suppress the deterioration in mobility of the field effect of electromagnetic wave detector 100, and thus it is possible to improve the performance of electromagnetic wave detector 100.

<Configurations of First Electrode Portion 2a and Second Electrode Portion 2b>

Materials of first electrode portion 2a and second electrode portion 2b may be any materials as long as they are conductors. Materials of first electrode portion 2a and second electrode portion 2b may contain at least any one of, for example, gold (Au), silver (Ag), copper (Cu), aluminum (Al), nickel (Ni), chromium (Cr) and palladium (Pd). An unillustrated close adherence layer may be provided between first electrode portion 2a and insulating film 3, or between second electrode portion 2b and semiconductor layer 4. The close adherence layer is formed to enhance the adherence. The material of close adherence layer includes, for example, metal materials such as chromium (Cr) or titanium (Ti).

<Configuration of Insulating Film 3>

A material of insulating film 3 is, for example, silicon oxide ($SiO_2$). The material of insulating film 3 is not limited to silicon oxide, and may be, for example, tetraethyl orthosilicate ($Si(OC_2H_5)_4$), silicon nitride ($Si_3N_4$), hafnium oxide ($HfO_2$), aluminum oxide ($Al_2O_3$), nickel oxide (NiO), boron nitride (BN) (boron nitride), and siloxane-based polymer materials. For example, the atomic arrangement of boron nitride (BN) resembles the atomic arrangement of graphene. Therefore, when boron nitride (BN) comes into contact with two-dimensional material layer 1 formed of graphene, deterioration in electron mobility of two-dimensional material layer 1 is suppressed. Therefore, boron nitride (BN) is suited for an insulating film 3 as an underlying film arranged under two-dimensional material layer 1.

Thickness of insulating film 3 is not particularly limited as long as first electrode portion 2a is electrically insulated with respect to semiconductor layer 4, and tunnel current is not generated between first electrode portion 2a and semiconductor layer 4. An insulating layer need not be arranged below two-dimensional material layer 1.

<Configuration of Semiconductor Layer 4>

A material of semiconductor layer 4 is, for example, a semiconductor material such as silicon (Si). Specifically, semiconductor layer 4 is, for example, a silicon substrate doped with impurities.

Semiconductor layer 4 may have a multilayer structure. Also, semiconductor layer 4 may be a pn-junction photodiode, a pin photodiode, a Schottky photodiode, or an avalanche photodiode. Also, semiconductor layer 4 may be a photo transistor.

In the present embodiment, while description is made for the case where the material constituting semiconductor layer 4 is a silicon substrate, the material of semiconductor layer 4 may be other material. Examples of materials of semiconductor layer 4 include silicon (Si), germanium (Ge), compound semiconductors such as group III-V semiconductors or group II-V semiconductors, cadmium mercury telluride (HgCdTe), iridium antimonide (InSb), lead selenide (PbSe), lead sulfide (PbS), cadmium sulfide (CdS), gallium nitride (GaN), silicon carbide (SiC), gallium phosphide (GaP), indium gallium arsenide (InGaAs), indium arsenide and (InAs). Semiconductor layer 4 may be a substrate including a quantum well or a quantum dot. The material of semiconductor layer 4 may be Type II superlattice. The material of semiconductor layer 4 may be a single material of the aforementioned materials, or may be a combination of the aforementioned materials.

It is desired that semiconductor layer 4 is doped with an impurity so that the resistivity is less than or equal to 100 $\Omega \cdot cm$. The readout speed (migration speed) of photo carrier in semiconductor layer 4 improves by doping semiconductor layer 4 at high concentration, and hence the response speed of electromagnetic wave detector 100 improves.

It is desired that semiconductor layer 4 has a thickness of less than or equal to 10 μm. As the thickness of semiconductor layer 4 decreases, the deactivation of photo carrier decreases.

<Configuration of Ferroelectric Layer 5>

A material of ferroelectric layer 5 may be appropriately determined as long as polarization occurs when an electromagnetic wave having a detection wavelength enters ferroelectric layer 5 made of the material. The material of ferroelectric layer 5 contains, for example, at least any one of barium titanate ($BaTiO_3$), lithium niobate ($LiNbO_3$), lithium tantalate ($LiTaO_3$), strontium titanate ($SrTiO_3$), lead zirconate titanate (PZT), strontium bismuth tantalate (SBT), bismuth ferrite (BFO), zinc oxide (ZnO), hafnium oxide ($HfO_2$) and polyvinylidene fluoride ferroelectric substances that are organic polymers ((PVDF, P(VDF-TrFE), P(VDF-TrFE-CTFE) and so on). Also, ferroelectric layer 5 may be configured by laminating or mixing a plurality of different ferroelectric materials.

The material of ferroelectric layer 5 is not limited to the above materials as long as the material is a pyroelectric substance exerting the pyroelectric effect. Specifically, it is only required that the material of ferroelectric layer 5 is a ferroelectric substance in which polarization changes with the change in thermal energy inside ferroelectric layer 5. In the pyroelectric effect, an electromagnetic wave simply acts as a heat source. Therefore, the pyroelectric effect does not basically have wavelength dependency. Therefore, ferroelectric layer 5 does not basically have wavelength dependency. Therefore, ferroelectric layer 5 has sensitivity for a broad band of electromagnetic waves.

The material of ferroelectric layer 5 may be a material having spontaneous polarization. When the material of ferroelectric layer 5 is a material having spontaneous polarization, the spontaneous polarization reduces as the temperature of ferroelectric layer 5 elevates by application of electromagnetic wave. Therefore, the photo carrier injected from ferroelectric layer 5 to two-dimensional material layer 1 and semiconductor layer 4 reduces.

Preferably, ferroelectric layer 5 is so configured that the change speed of dielectric polarization inside ferroelectric layer 5 is as fast as possible. Specifically, it is desired to make the thickness (film thickness) of ferroelectric layer 5 be as small as possible as far as voltage can be applied between two-dimensional material layer 1 and semiconductor layer 4.

It is desired that the thickness of ferroelectric layer 5 is such a thickness that the largest possible voltage is applied between two-dimensional material layer 1 and semiconductor layer 4 when an electromagnetic wave is applied to two-dimensional material layer 1. While the polarization direction of ferroelectric layer 5 is not particularly limited, the polarization direction is desirably such a direction that voltage is applied between two-dimensional material layer 1 and semiconductor layer 4.

On ferroelectric layer 5, an unillustrated protective film may be provided. The unillustrated protective film may be provided in such a manner to cover two-dimensional material layer 1, first electrode portion 2a, and semiconductor layer 4. A material of the protective film is, for example, an insulating substance such as an oxide or a nitride or the like. Examples of the material of the protective film include silicon oxide ($SiO_2$), silicon nitride (SiN), hafnium oxide ($HfO_2$), aluminum oxide ($Al_2O_3$), boron nitride (BN) and the like.

Electromagnetic wave detector 100 may further include an unillustrated Mot insulator. The unillustrated Mot insulator is so configured that physical properties such as temperature varies due to occurrence of photo-induced phase transition by application of light. The unillustrated Mot insulator is in contact with ferroelectric layer 5.

<Method for Producing Electromagnetic Wave Detector 100>

Next, referring to FIG. 1, a method for producing electromagnetic wave detector 100 according to Embodiment 1 is described.

A method for producing electromagnetic wave detector 100 includes a preparatory step, a second electrode portion forming step, a ferroelectric layer forming step, an insulating film forming step, a first electrode portion forming step, an opening forming step, and a two-dimensional material layer forming step.

First, the preparatory step is performed. In the preparatory step, as shown in FIG. 1, a flat semiconductor substrate containing silicon (Si) or the like is prepared as semiconductor layer 4. The material of the semiconductor substrate is a material having sensitivity to a predetermined detection wavelength.

Subsequently, the second electrode portion forming step is performed. In the second electrode portion forming step, a protective film is formed on first surface 4a of semiconductor layer 4. The protective film is, for example, a resist. In the state that first surface 4a of semiconductor layer 4 is protected by the protective film, second electrode portion 2b is deposited on second surface 4b of semiconductor layer 4. Before deposition of second electrode portion 2b, an unillustrated close adherence layer may be formed in a region of second surface 4b of semiconductor layer 4 where second electrode portion 2b is to be deposited. The second electrode portion forming step may be performed after any step from the ferroelectric layer forming step to the two-dimensional material layer 1 forming step as long as first surface 4a of semiconductor layer 4 is protected by the protective film.

Subsequently, the ferroelectric layer forming step is performed. In the ferroelectric layer forming step, ferroelectric layer 5 is formed on semiconductor layer 4. A method for forming the ferroelectric layer may be appropriately determined. For example, when ferroelectric layer 5 is formed of a polymer material, ferroelectric layer 5 is formed by forming a polymer film by a spin coating method or the like, and then processing the polymer film by a photolithographic method. When the material of ferroelectric layer 5 is a material other than a polymer material, after formation of ferroelectric layer 5 by sputtering, vapor deposition or a metal organic decomposition method (MOD coating method, MOD: Metal Organic Decomposition), an ALD (Atomic Layer Deposition) method or the like, ferroelectric layer 5 is patterned by a photolithography method. Also, a method called lift-off may be used. In the method called lift-off, after depositing ferroelectric layer 5 by using a resist mask is used as a mask, the resist mask is removed.

Subsequently, the insulating film forming step is performed. In the insulating film forming step, insulating film 3 is formed on the surface of semiconductor layer 4 and ferroelectric layer 5. For example, when the material of semiconductor layer 4 is silicon (Si), insulating film 3 may be heat-oxidized silicon oxide (SiO$_2$). Also, the method of depositing insulating film 3 may be a CVD (Chemical Vapor Deposition) method or a sputtering method.

Subsequently, the first electrode portion forming step is performed. In the first electrode portion forming step, first electrode portion 2a is formed on insulating film 3. Before formation of first electrode portion 2a, a close adherence layer may be formed in a region of insulating film 3 where first electrode portion 2a is to be formed.

As a method for forming first electrode portion 2a, for example, the following process is used. First, a resist mask is formed on insulating film 3 by photochemical engraving or electron beam (EB) lithography. In a region of the resist mask where first electrode portion 2a is to be formed, an open part is formed. Thereafter, a film of metal or the like that is to be first electrode portion 2a is formed on the resist mask. For formation of the film, an evaporation method or a sputtering method or the like is used. At this time, the film is formed to extend from inside the open region of the resist mask to the top surface of the resist mask. Thereafter, the resist mask is removed together with a part of the film. The other part of the film having been arranged in the open region of the resist mask remains on insulating film 3 to become first electrode portion 2a. The above-described method is generally called a lift-off method.

As a method for forming first electrode portion 2a, other method may be used. For example, on insulating film 3, a film such as a metal film that is to be first electrode portion 2a is previously deposited. Thereafter, a resist mask is formed on the film by the photolithography method. The resist mask is formed to cover the region where first electrode portion 2a is to be formed, but is not formed in the region other than the region where first electrode portion 2a is to be formed. Thereafter, the film is partially removed by the wet etching or dry etching with the resist mask being a mask. As a result, a part of the film remains under the resist mask. The part of the film becomes first electrode portion 2a. Thereafter, the resist mask is removed. First electrode portion 2a may be formed in this manner.

Subsequently, the opening forming step is performed. In the opening forming step, insulating film 3 is provided with opening OP. Specifically, an unillustrated resist mask is formed on insulating film 3 by photochemical engraving or electron beam lithography. An open part is formed in a region of the resist mask where opening OP is to be formed in insulating film 3. Thereafter, insulating film 3 is etched with the resist mask being an etching mask. The etching technique is appropriately selected from either of the wet etching and the dry etching. After the etching, the resist mask is removed. The opening forming step may be performed previous to the first electrode portion forming step.

Subsequently, the two-dimensional material layer forming step is performed. In the two-dimensional material layer forming step, two-dimensional material layer 1 is formed so that first electrode portion 2a, insulating film 3, and semiconductor layer 4 exposed inside opening OP are coved with two-dimensional material layer 1. The method for forming two-dimensional material layer 1 is not particularly limited. Two-dimensional material layer 1 may be formed, for example, by epitaxial growth, or may be formed by screen printing. Also, two-dimensional material layer 1 may be formed by transferring and bonding a two-dimensional material film that has been deposited in advance by a CVD method. Two-dimensional material layer 1 may be formed by transferring and bonding a two-dimensional material film that has been peeled off by mechanical peeling or the like.

After forming two-dimensional material layer 1, a resist mask is formed on two-dimensional material layer 1 by photochemical engraving or the like. The resist mask is formed such that it covers the region where two-dimensional material layer 1 is to be formed, while exposing the remaining region. Thereafter, two-dimensional material layer 1 is etched with the resist mask being an etching mask. The etching technique is, for example, dry etching by oxygen plasma. Thereafter, the resist mask is removed. As a result, two-dimensional material layer 1 shown in FIG. 1 is formed.

Through the above steps, electromagnetic wave detector 100 is produced.

While two-dimensional material layer 1 is formed on first electrode portion 2a in the above-described production method, first electrode portion 2a may be formed to overlap a part of two-dimensional material layer 1 after forming two-dimensional material layer 1 on insulating film 3. In this case, however, it is necessary to take care not to injure two-dimensional material layer 1 by the formation process of first electrode portion 2a at the time of forming first electrode portion 2a. For example, since first electrode portion 2a is formed in the state that other region than the region where first electrode portion 2a is to be overlapped in two-dimensional material layer 1 is preliminarily covered with a protective film or the like, first electrode portion 2a is prevented from being injured in the formation process.

\<Principle of Operation of Electromagnetic Wave Detector 100\>

Next, with reference to FIG. 1, the principle of operation of electromagnetic wave detector 100 according to Embodiment 1 is described.

As shown in FIG. 1, first, voltmeter VM or ammeter IM (see FIG. 5) is electrically connected between first electrode portion 2a and second electrode portion 2b. First electrode portion 2a, two-dimensional material layer 1, semiconductor layer 4 and second electrode portion 2b are electrically connected sequentially. Voltage of a current or a current flowing in two-dimensional material layer 1 is measured by voltmeter VM or ammeter IM (see FIG. 5). Bias voltage need not be applied to two-dimensional material layer 1. When bias voltage is not applied to two-dimensional material layer 1, the dark current is zero because no voltage is applied. That is, electromagnetic wave detector 100 performs an OFF operation.

Next, an electromagnetic wave is applied to ferroelectric layer 5. By the pyroelectric effect of ferroelectric layer 5, dielectric polarization changes inside ferroelectric layer 5. As a result, electric charges are injected into semiconductor layer 4 from ferroelectric layer 5. Accordingly, bias voltage is artificially applied to electromagnetic wave detector 100. Therefore, the resistance between first electrode portion 2a and second electrode portion 2b changes. The phenomenon that change in Fermi level inside two-dimensional material layer 1 causes change in resistance of electromagnetic wave detector 100 is called an photobiasing effect. Change in resistance between first electrode portion 2a and second electrode portion 2b results in change in voltage and current between first electrode portion 2a and second electrode portion 2b. By detection of either of change in voltage and change in current, it is possible to detect the electromagnetic wave applied to electromagnetic wave detector 100.

Voltage may further be applied between first electrode portion 2a and second electrode portion 2b. Preferably, the voltage is set to be forward bias for the Schottky junction between two-dimensional material layer 1 and semiconductor layer 4. By application of the voltage, a current flows in two-dimensional material layer 1 arranged between first electrode portion 2a and second electrode portion 2b. Since first electrode portion 2a to second electrode portion 2b become a path in which a current flows, two-dimensional material layer 1 also becomes a path in which a current flows. For example, when a semiconductor that forms semiconductor layer 4 is made of silicon (Si) which is a p-type material, and two-dimensional material layer 1 is made of graphene which is an n-type material, two-dimensional material layer 1 and semiconductor layer 4 are joined by Schottky junction. Thus, by adjusting the voltage so that forward bias is applied to the Schottky junction, it is possible to amplify a variation in current even when the dielectric polarization of ferroelectric layer 5 is minute.

Further, by application of the electromagnetic wave to ferroelectric layer 5, the dielectric polarization of ferroelectric layer 5 changes by pyroelectric effect, and thus the Fermi level of two-dimensional material layer 1 or semiconductor layer 4 modulates. Accordingly, the energy barrier between two-dimensional material layer 1 and semiconductor layer 4 deteriorates. Thus, a current flows in semiconductor layer 4 only when an electromagnetic wave is applied to electromagnetic wave detector 100, so that it is possible to detect a current only when an electromagnetic wave is applied to electromagnetic wave detector 100.

The configuration of electromagnetic wave detector 100 is not limited to the aforementioned configuration of detecting change in current. For example, change in voltage between first electrode portion 2a and second electrode portion when an electromagnetic wave is applied to electromagnetic wave detector 100 in the condition that a constant current flows between first electrode portion 2a and second electrode portion 2b may be detected. The change in voltage between first electrode portion 2a and second electrode portion 2b when an electromagnetic wave is applied to electromagnetic wave detector 100 is change in voltage in two-dimensional material layer 1.

Also, the above-described electromagnetic wave detector 100 may be arranged as a first electromagnetic wave detector, and a second electromagnetic wave detector having the same configuration as the first electromagnetic wave detector may further be arranged. The first electromagnetic wave detector is arranged in a space where an electromagnetic wave is applied. The second electromagnetic wave detector is arranged in a space shielded from an electromagnetic wave. The detection may be performed by detecting difference between the current of the first electromagnetic wave detector and the current of the second electromagnetic wave detector. The detection may be performed by detecting difference between the voltage of the first electromagnetic wave detector and the voltage of the second electromagnetic wave detector.

<Operation of Electromagnetic Wave Detector 100>

Next, with reference to FIG. 1, a specific operation of electromagnetic wave detector 100 according to Embodiment 1 is described. Description is made for the case where p-type silicon (Si) is used as semiconductor layer 4, graphene is used as two-dimensional material layer 1 and lithium niobate ($LiNbO_3$) is used as ferroelectric layer 5.

Voltmeter VM is connected to the Schottky junction between two-dimensional material layer 1 and semiconductor layer 4. The detection wavelength of electromagnetic wave detector 100 is determined according to the absorption wavelength of lithium niobate ($LiNbO_3$).

Incidence of an electromagnetic wave having a detection wavelength into ferroelectric layer 5 causes change in dielectric polarization in ferroelectric layer 5 by the pyroelectric effect. By the change in polarization in ferroelectric layer 5, change in voltage occurs inside electromagnetic wave detector 100. This is a phenomenon due to the above-described photobiasing effect. Since the mobility of photo carrier in graphene that constitutes two-dimensional material layer 1 is large, a large displacement current is obtained for slight change in voltage. Therefore, the Fermi level of two-dimensional material layer 1 largely changes by the pyroelectric effect of ferroelectric layer 5. As a result, the energy barrier between two-dimensional material layer 1 and semiconductor layer 4 deteriorates. Therefore, large voltage change or current change occurs between first electrode portion 2a and second electrode portion 2b. Thus, by the pyroelectric effect of ferroelectric layer 5, voltage change or current change in electromagnetic wave detector 100 occurs.

Further, when the change speed of the dielectric polarization of ferroelectric layer 5 is set to be as short as possible, the time from incidence of the electromagnetic wave into electromagnetic wave detector 100 to occurrence of change in resistance in two-dimensional material layer 1 decreases. As a result, delay of amplification of photo carrier by the photobiasing effect is suppressed, and response speed of electromagnetic wave detector 100 increases.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 1, ferroelectric layer 5 is electrically connected to at least any one of first electrode portion 2a, second electrode portion 2b and semiconductor layer 4. By the pyroelectric effect of ferroelectric layer 5, voltage change or current change in electromagnetic wave detector 100 occurs. The pyroelectric effect of ferroelectric layer 5 does not depend on the wavelength of the electromagnetic wave. Therefore, the sensitivity of electromagnetic wave detector 100 does not depend on the quantum efficiency of semiconductor layer 4. Therefore, even for a wavelength for which the quantum efficiency of semiconductor layer 4 decreases, decrease in sensitivity of electromagnetic wave detector 100 is suppressed. Therefore, the sensitivity of electromagnetic wave detector 100 improves. Specifically, it is possible to realize high sensitivity that exceeds 100% by quantum efficiency.

More specifically, a variation in current in two-dimensional material layer 1 caused by polarization in ferroelectric layer 5 due to pyroelectric effect is larger than a variation in current in a normal semiconductor. Especially, in two-dimensional material layer 1, large current change occurs for slight voltage change as compared with a normal semiconductor. For example, when monolayer graphene is used as two-dimensional material layer 1, the thickness of two-dimensional material layer 1 is very thin because it corresponds to a single atomic layer. The mobility of electron in monolayer graphene is large. In this case, the variation in two-dimensional material layer 1, calculated from the mobility of electron, thickness and the like in two-dimensional material layer 1, is about several hundred times to several thousand times the variation of current in a normal semiconductor. The effect of changing the energy barrier between two-dimensional material layer 1 and semiconductor layer 4 due to large change in Fermi level of two-dimensional material layer 1 by artificially applying bias voltage to electromagnetic wave detector 100 by the pyroelectric effect of ferroelectric layer 5 is called an photobiasing effect.

The extraction efficiency of detection current in two-dimensional material layer 1 greatly improves by the photobiasing effect. The photobiasing effect does not directly enhance the quantum efficiency of a photoelectric conversion material as is a normal semiconductor, but increases the variation in current by incidence of an electromagnetic wave. Therefore, the quantum efficiency of electromagnetic wave detector 100 calculated from a differential current by incidence of an electromagnetic wave can exceed 100%. Therefore, the detection sensitivity of electromagnetic wave by electromagnetic wave detector 100 according to the present embodiment is higher, in comparison with a semiconductor electromagnetic wave detector or a graphene electromagnetic wave detector in which photobiasing effect is not applied.

As shown in FIG. 1, in electromagnetic wave detector 100, an electric field generated from ferroelectric layer 5 is shielded with respect to two-dimensional material layer 1. More specifically, since a part of ferroelectric layer 5 facing with two-dimensional material layer 1, and two-dimensional material layer 1 sandwich at least any one of first electrode portion 2a, second electrode portion 2b and semiconductor layer 4, the electric field generated from ferroelectric layer 5 is shielded with respect to two-dimensional material layer 1. That is, exertion of the electric field effect on two-dimensional material layer 1 is suppressed. If the electric field generated from ferroelectric layer 5 is not shielded with respect to two-dimensional material layer 1, the Fermi level of two-dimensional material layer 1 will significantly change by the electric field effect of the electric field generated from ferroelectric layer 5. Accordingly, there is a possibility that the detection sensitivity of electromagnetic wave detector 100 deteriorates due to change in characteristics of electromagnetic wave detector 100. In the present embodiment, since the electric field generated from ferroelectric layer 5 is shielded with respect to two-dimensional material layer 1, it is possible to suppress deterioration in detection sensitivity of electromagnetic wave detector 100.

As shown in FIG. 1, two-dimensional material layer 1 is electrically connected to semiconductor layer 4 in opening OP. Two-dimensional material layer 1 is joined with semiconductor layer 4 by Schottky junction in opening OP. Therefore, when reverse bias is applied to two-dimensional material layer 1, a current does not flow in two-dimensional material layer 1. That is, it is possible to prevent a dark current from flowing in two-dimensional material layer 1. Therefore, electromagnetic wave detector 100 can perform an OFF operation. Also, when forward bias is applied to two-dimensional material layer 1, large current change is obtained with a small voltage change. Therefore, the sensitivity of electromagnetic wave detector 100 improves. As a result, it is possible to realize both improvement in sensitivity of electromagnetic wave detector 100 and OFF operation of electromagnetic wave detector 100.

As shown in FIG. 1, in insulating film 3, opening OP is formed. Accordingly, electromagnetic wave detector 100 is capable of simultaneously detecting an electromagnetic wave having entered semiconductor layer 4 through opening OP. By incidence of electromagnetic wave into semiconductor layer 4, a photo carrier is generated in semiconductor layer 4. The photo carrier is outputted to first electrode portion 2a through two-dimensional material layer 1. Two-dimensional material layer 1 has a part arranged on insulating film 3 (third part 1c). Therefore, the electric field change by the photo carrier generated in semiconductor layer 4 is applied to two-dimensional material layer 1 via insulating film 3. In comparison with the case where two-dimensional material layer 1 does not have third part 1c, the conductivity of two-dimensional material layer 1 by the photogating effect is likely to be modulated more largely. Therefore, the sensitivity of electromagnetic wave detector 100 improves.

Also, the variation in current when an electromagnetic wave is applied to electromagnetic wave detector 100 includes the variation by photoelectric current generated by photoelectric conversion in two-dimensional material layer 1. Therefore, by application of electromagnetic wave to electromagnetic wave detector 100, photobiasing effect, photogating effect and photoelectric conversion are generated. Therefore, electromagnetic wave detector 100 is capable of detecting change in current by the photobiasing effect, photogating effect and photoelectric conversion. Therefore, the sensitivity of electromagnetic wave detector 100 improves.

As shown in FIG. 1, electromagnetic wave detector 100 is configured to detect an electromagnetic wave by detecting change in at least one of voltage of a current and a current flowing between first electrode portion 2a and second electrode portion 2b by at least one of voltmeter VM and ammeter IM. Therefore, an electromagnetic wave can be detected by using at least one of voltmeter VM and ammeter IM.

Two-dimensional material layer 1 contains a material selected from the group consisting of graphene, transition metal dichalcogenide, black phosphorus, silicene, graphene nanoribbon, and borophene. Therefore, it is possible to securely obtain the operation and effect of the present embodiment.

Ferroelectric layer 5 is arranged such that voltage in a forward bias direction is applied to two-dimensional material layer 1 and semiconductor layer 4. It is possible to obtain large photo current for small voltage change. Therefore, the sensitivity of electromagnetic wave detector 100 improves.

Silicon (Si) may be used for semiconductor layer 4. Therefore, it is possible to form a readout circuit inside semiconductor layer 4. This makes it possible to remove the necessity of further forming another circuit outside electromagnetic wave detector 100.

Embodiment 2

Figure 7:
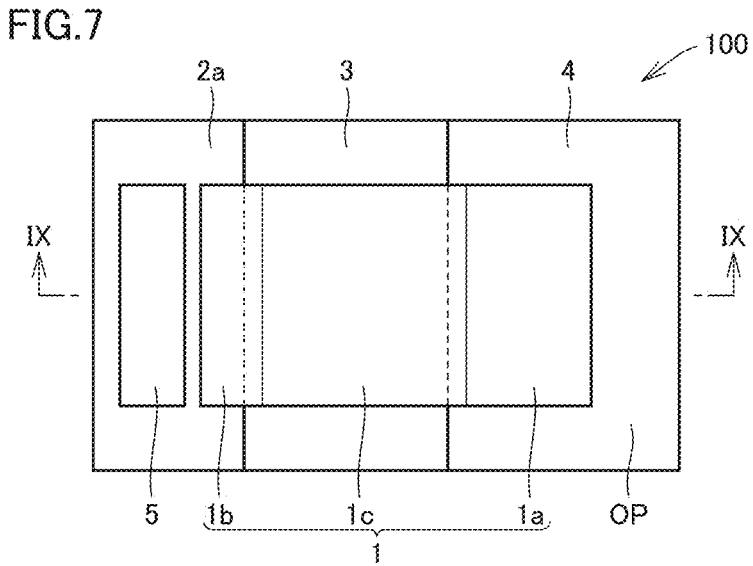
FIG. 7 is a top view schematically showing a configuration of an electromagnetic wave detector according to Embodiment 2.
Figure 8:
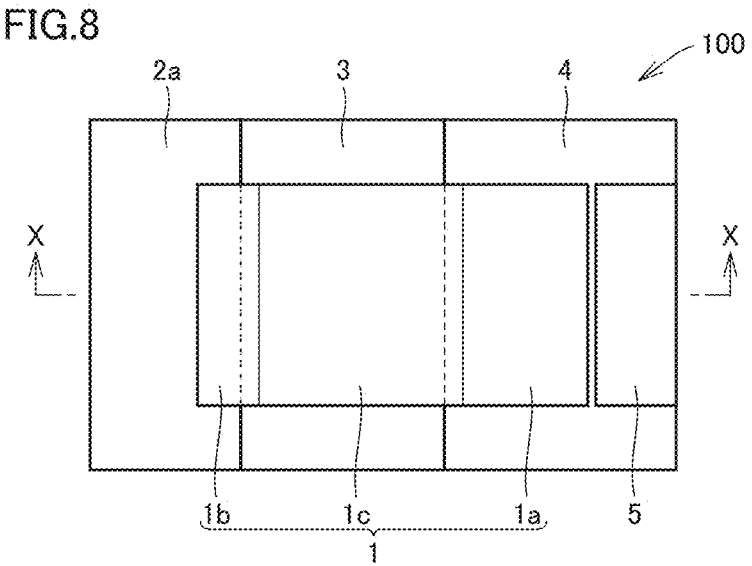
FIG. 8 is a top view schematically showing a configuration of an electromagnetic wave detector according to a modified example of Embodiment 2.
Figure 9:
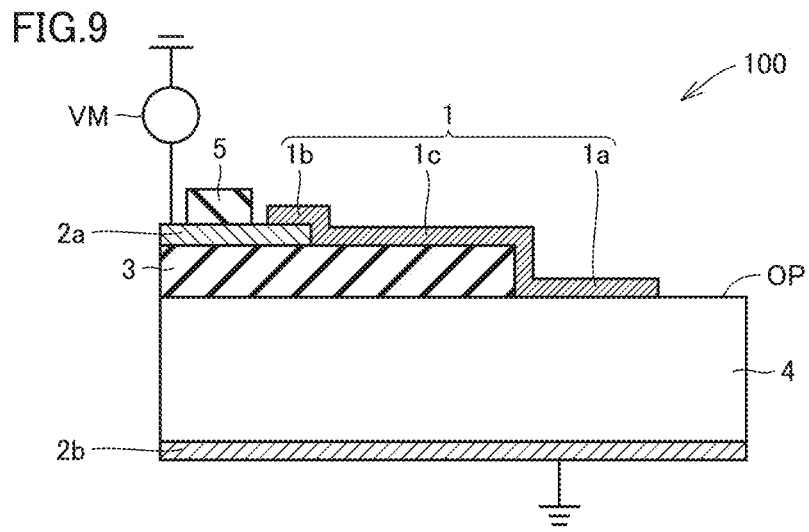
FIG. 9 is a section view schematically showing a configuration of the electromagnetic wave detector according to Embodiment 2.
Figure 10:
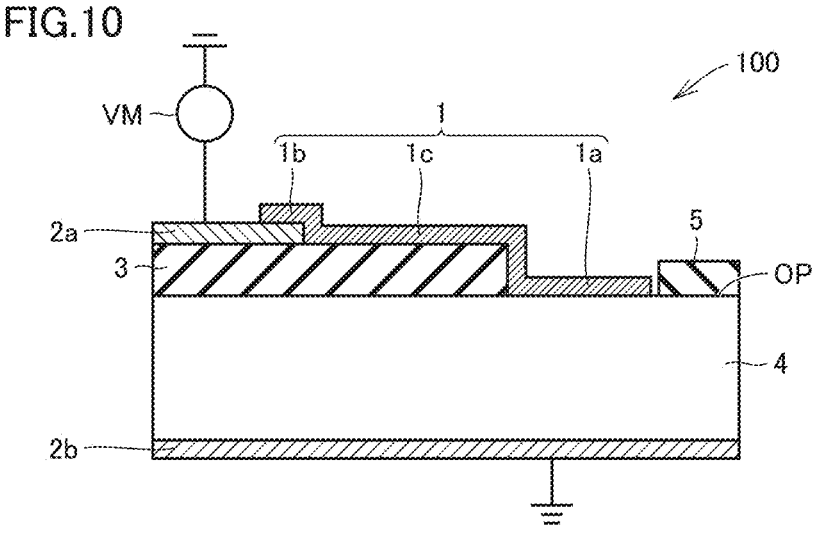
FIG. 10 is a section view schematically showing a configuration of the electromagnetic wave detector according to the modified example of Embodiment 2.

Next, referring to FIGS. 7 to 10, a configuration of electromagnetic wave detector 100 according to Embodiment 2 is described. Embodiment 2 has the same configuration and operation and effect as Embodiment 1 unless otherwise described. Therefore, the same configuration as that in Embodiment 1 is denoted by the same reference numeral, and description thereof is not repeated. FIG. 9 is a section view in the IX-IX line of FIG. 7. FIG. 10 is a section view in the X-X line of FIG. 8.

As shown in FIGS. 7 and 8, in electromagnetic wave detector 100 according to the present embodiment, ferroelectric layer 5 is arranged so as not to be overlapped with two-dimensional material layer 1 in plan view. That is, ferroelectric layer 5 is misaligned from two-dimensional material layer 1 in plan view. Electromagnetic wave detector 100 according to the present embodiment is different from electromagnetic wave detector 100 according to Embodiment 1 in that ferroelectric layer 5 is arranged so as not to be overlapped with two-dimensional material layer 1 in plan view. In the present embodiment, the term plan view means viewing electromagnetic wave detector 100 along the direction from first electrode portion 2a toward second electrode portion 2b (see FIGS. 9 and 10).

The electric field generated in ferroelectric layer 5 is generated along the direction from first electrode portion 2a toward second electrode portion 2b. That is, the electric field generated in ferroelectric layer 5 is generate along the direction of plan view.

Ferroelectric layer 5 may be arranged on first electrode portion 2a as shown in FIG. 9 as long as ferroelectric layer 5 is arranged so as not to be overlapped with two-dimensional material layer 1 in plan view. Ferroelectric layer 5 may be arranged on semiconductor layer 4 as shown in FIG. 10 as long as ferroelectric layer 5 is arranged so as not to be overlapped with two-dimensional material layer 1 in plan view.

The configuration of electromagnetic wave detector 100 according to the present embodiment may be applied to other embodiments.

<Operation and Effect>

According to electromagnetic wave detector 100 according to the present embodiment, as shown in FIGS. 7 and 8, ferroelectric layer 5 is arranged so as not to be overlapped with two-dimensional material layer 1 in plan view. Therefore, it is possible to prevent the electric field generated in ferroelectric layer 5 from reaching two-dimensional material layer 1. That is, exertion of the electric field effect on two-dimensional material layer 1 is suppressed. If the electric field generated from ferroelectric layer 5 is not shielded with respect to two-dimensional material layer 1, the Fermi level of two-dimensional material layer 1 will significantly change by the electric field effect of the electric field generated from ferroelectric layer 5. Accordingly, there is a possibility that the detection sensitivity of electromagnetic wave detector 100 deteriorates due to change in characteristics of electromagnetic wave detector 100. In the present embodiment, since ferroelectric layer 5 is arranged so as not to be overlapped with two-dimensional material layer 1 in plan view, it is possible to suppress deterioration in detection sensitivity of electromagnetic wave detector 100.

Embodiment 3

Figure 11:
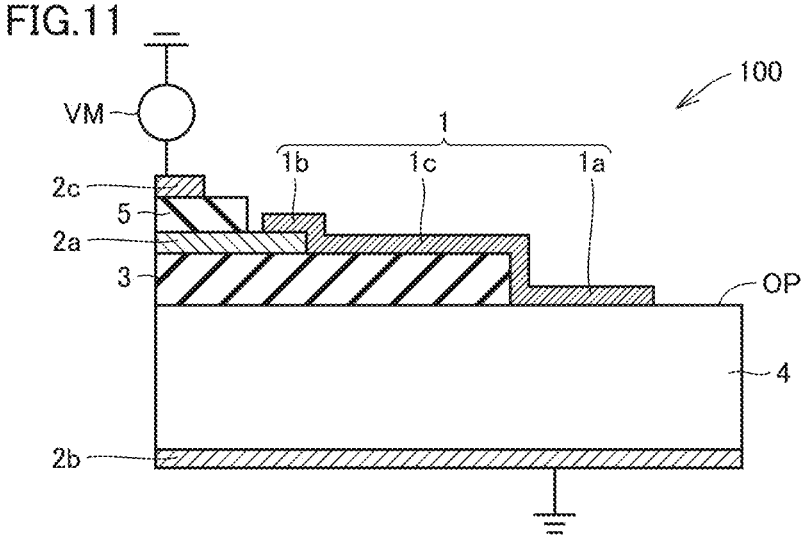
FIG. 11 is a section view schematically showing a configuration of an electromagnetic wave detector according to Embodiment 3.
Figure 12:
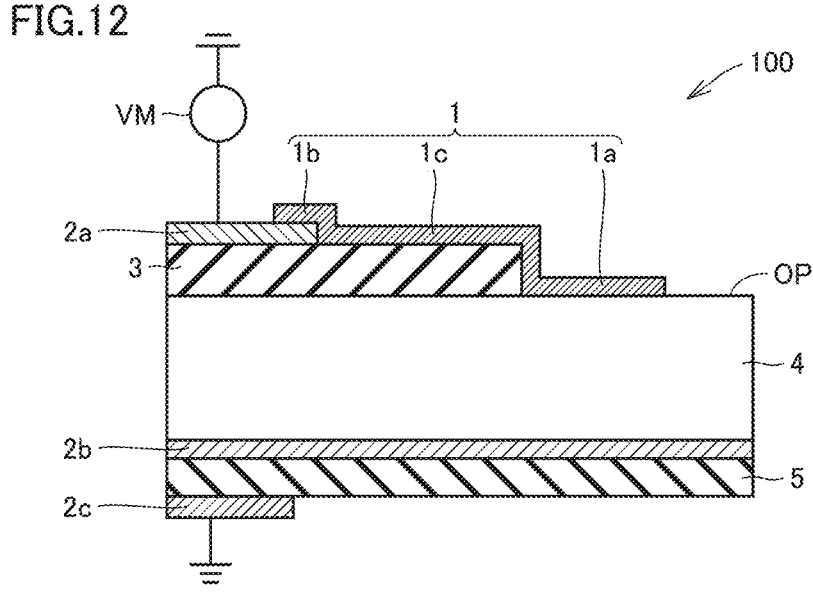
FIG. 12 is a section view schematically showing a configuration of an electromagnetic wave detector according to a modified example of Embodiment 3.

Next, referring to FIGS. 11 and 12, a configuration of electromagnetic wave detector 100 according to Embodiment 3 is described. Embodiment 3 has the same configuration and operation and effect as Embodiment 1 unless otherwise described. Therefore, the same configuration as that in Embodiment 1 is denoted by the same reference numeral, and description thereof is not repeated.

As shown in FIGS. 11 and 12, electromagnetic wave detector 100 according to the present embodiment further includes a third electrode portion 2c. Electromagnetic wave detector 100 according to the present embodiment differs from electromagnetic wave detector 100 according to Embodiment 1 in that electromagnetic wave detector 100 further includes third electrode portion 2c. Third electrode portion 2c and one of first electrode portion 2a and second electrode portion 2b sandwich ferroelectric layer 5. Third electrode portion 2c is in contact with ferroelectric layer 5. Electromagnetic wave detector 100 is configured to detect a detection signal outputted from third electrode portion 2c. That is, electromagnetic wave detector 100 according to the present embodiment is featured by extracting an electric signal from between third electrode portion 2c and first electrode portion 2a or second electrode portion 2b. It is preferred that the polarization direction of ferroelectric layer 5 is orthogonal to the surface on which the electrode is formed. When electromagnetic wave detector 100 includes power source PW (see FIG. 6), voltage may be applied to third electrode portion 2c by power source PW (see FIG. 6).

In FIG. 11, ferroelectric layer 5 is arranged opposite to semiconductor layer 4 with respect to first electrode portion 2a. Third electrode portion 2c is arranged opposite to first electrode portion 2a with respect to ferroelectric layer 5. Therefore, third electrode portion 2c and first electrode portion 2a sandwich ferroelectric layer 5. Therefore, third electrode portion 2c and first electrode portion 2a directly sandwich ferroelectric layer 5.

In FIG. 12, ferroelectric layer 5 may be arranged opposite to semiconductor layer 4 with respect to second electrode portion 2b. Third electrode portion 2c may be arranged opposite to second electrode portion 2b with respect to ferroelectric layer 5. Therefore, third electrode portion 2c and second electrode portion 2b sandwich ferroelectric layer 5. Therefore, third electrode portion 2c and second electrode portion 2b directly sandwich ferroelectric layer 5.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIGS. 11 and 12, third electrode portion 2c and one of first electrode portion 2a and second electrode portion 2b sandwich semiconductor layer 4. Therefore, electromagnetic wave detector 100 is featured by extracting an electric signal from between third electrode portion 2c and first electrode portion 2a or second electrode portion 2b. Therefore, it is possible to efficiently extract electric charges generated by polarization change in ferroelectric layer 5 via third electrode portion 2c. Therefore, the sensitivity of electromagnetic wave detector 100 improves. Also, the detection signal is outputted after passing through ferroelectric layer 5 and third electrode portion 2c. Since ferroelectric layer 5 has high insulating performance, it is possible to reduce the dark current of electromagnetic wave detector 100. Therefore, the sensitivity of electromagnetic wave detector 100 improves. Also, by applying voltage to the third electrode portion 2c, it is possible to control the polarization of ferroelectric layer 5. As a result, it is possible to increase the polarization change by application of electromagnetic wave. Therefore, the sensitivity of electromagnetic wave detector 100 improves.

Embodiment 4

Figure 13:
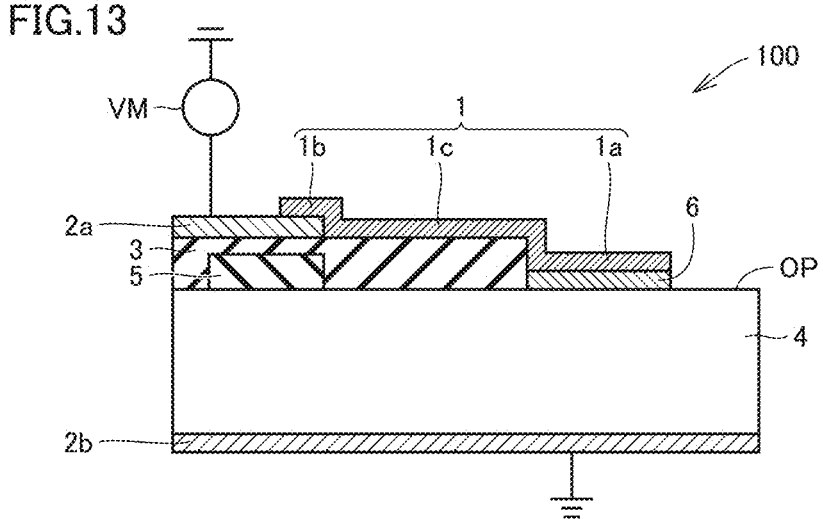
FIG. 13 is a section view schematically showing a configuration of an electromagnetic wave detector according to Embodiment 4.

Next, referring to FIG. 13, a configuration of electromagnetic wave detector 100 according to Embodiment 4 is described. Embodiment 4 has the same configuration and operation and effect as Embodiment 1 unless otherwise described. Therefore, the same configuration as that in Embodiment 1 is denoted by the same reference numeral, and description thereof is not repeated.

As shown in FIG. 13, electromagnetic wave detector 100 according to the present embodiment further includes a tunnel insulating layer 6. Electromagnetic wave detector 100 according to the present embodiment differs from electromagnetic wave detector 100 according to Embodiment 1 in that electromagnetic wave detector 100 further includes tunnel insulating layer 6. Tunnel insulating layer 6 is sandwiched between two-dimensional material layer 1 and semiconductor layer 4. Tunnel insulating layer 6 electrically connects semiconductor layer 4 and first part 1a. Therefore, in the present embodiment, first part 1a is connected to semiconductor layer 4 with tunnel insulating layer 6 interposed therebetween. Tunnel insulating layer 6 is arranged inside opening OP.

Tunnel insulating layer 6 has such a thickness that can form a tunnel current between two-dimensional material layer 1 and semiconductor layer 4 when an electromagnetic wave having a detection wavelength enters two-dimensional material layer 1 and ferroelectric layer 5. Tunnel insulating layer 6 is, for example, an insulating layer having a thickness of greater than or equal to 1 nm and less than or equal to 10 nm. The insulating layer contains at least any one of, for example, a metal oxide such as alumina (aluminum oxide) or hafnium oxide ($HfO_2$), an oxide including a semiconductor such as silicon oxide (SiO) or silicon nitride ($Si_3N_4$), and a nitride such as boron nitride (BN).

While the method for preparing tunnel insulating layer 6 may be appropriately determined, it can be selected, for example, from an ALD (atomic layer deposition) method, a vacuum evaporation method, and a sputtering method. Tunnel insulating layer 6 may be formed by oxidizing or nitriding the surface of semiconductor layer 4. Tunnel insulating layer 6 may be a natural oxide film formed on the surface of semiconductor layer 4.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 13, tunnel insulating layer 6 is sandwiched between two-dimensional material layer 1 and semiconductor layer 4. Tunnel insulating layer 6 has such a thickness that can form a tunnel current between two-dimensional material layer 1 and semiconductor layer 4 when an electromagnetic wave having a detection wavelength enters two-dimensional material layer 1 and ferroelectric layer 5. Accordingly, a tunnel current is generated by incidence of electromagnetic wave. Therefore, the injection efficiency of photo current injected into two-dimensional material layer 1 through semiconductor layer 4 and tunnel insulating layer 6 improves. As a result, large photo current is injected into two-dimensional material layer 1. Therefore, the sensitivity of electromagnetic wave detector 100 improves. Also, by tunnel insulating layer 6, it is possible to suppress leakage current in the junction interface between two-dimensional material layer 1 and semiconductor layer 4. As a result, it is possible reduce the dark current.

Embodiment 5

Figure 14:
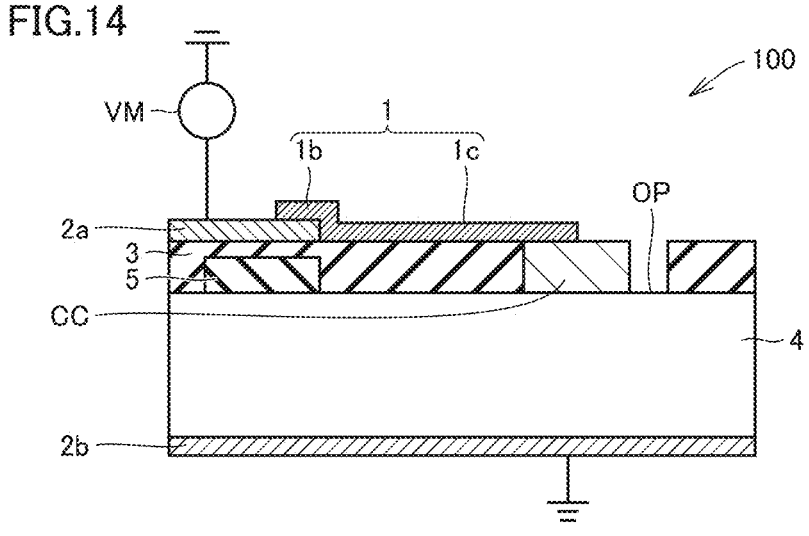
FIG. 14 is a section view schematically showing a configuration of an electromagnetic wave detector according to Embodiment 5.

Next, referring to FIG. 14, a configuration of electromagnetic wave detector 100 according to Embodiment 5 is described. Embodiment 5 has the same configuration and operation and effect as Embodiment 1 unless otherwise described. Therefore, the same configuration as that in Embodiment 1 is denoted by the same reference numeral, and description thereof is not repeated.

As shown in FIG. 14, electromagnetic wave detector 100 according to the present embodiment further includes a connection conductor CC. Electromagnetic wave detector 100 according to the present embodiment differs from electromagnetic wave detector 100 according to Embodiment 1 in that electromagnetic wave detector 100 further includes connection conductor CC. Two-dimensional material layer 1 is electrically connected to semiconductor layer 4 with connection conductor CC interposed therebetween. Connection conductor CC is arranged inside opening OP.

On the top face of connection conductor CC, two-dimensional material layer 1 is overlaid. The bottom face of connection conductor CC is electrically connected to first surface 4a of semiconductor layer 4. Two-dimensional material layer 1 is electrically connected to the top face of connection conductor CC. The position of the top face of connection conductor CC is the same as the position of the top face of insulating film 3. Two-dimensional material layer 1 extends planarly from the top face of insulating film 3 onto the top face of connection conductor CC without bending.

The contact resistance between connection conductor CC and two-dimensional material layer 1 is smaller than the contact resistance between two-dimensional material layer 1 and semiconductor layer 4. The contact resistance between connection conductor CC and semiconductor layer 4 is smaller than contact resistance between two-dimensional material layer 1 and semiconductor layer 4. The sum of the contact resistance between connection conductor CC and two-dimensional material layer 1 and the contact resistance between connection conductor CC and semiconductor layer 4 is smaller than the contact resistance between two-dimensional material layer 1 and semiconductor layer 4.

When an electromagnetic wave enters ferroelectric layer 5 through connection conductor CC, it is desired that connection conductor CC has high transmittance at the wavelength of electromagnetic wave to be detected by electromagnetic wave detector (detection wavelength).

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 14, two-dimensional material layer 1 is electrically connected to semiconductor layer 4 with connection conductor CC interposed therebetween. The sum of the contact resistance between connection conductor CC and two-dimensional material layer 1 and the contact resistance between connection conductor CC and semiconductor layer 4 is smaller than the contact resistance between two-dimensional material layer 1 and semiconductor layer 4. Therefore, it is possible to reduce the contact resistance as compared with the case where two-dimensional material layer 1 and semiconductor layer 4 are directly joined. Therefore, it is possible to suppress attenuation of a detection signal of electromagnetic wave. Therefore, the sensitivity of electromagnetic wave detector 100 improves. Also, since connection conductor CC and semiconductor layer 4 are joined by Schottky junction, it is possible to suppress the dark current.

It is preferred that the position of the top face of connection conductor CC is the same as the position of the top face of insulating film 3. In this case, since two-dimensional material layer 1 is formed horizontally without being bent, the mobility of photo carrier in two-dimensional material layer 1 improves. Therefore, it is possible to improve the detection sensitivity of electromagnetic wave detector 100.

Embodiment 6

Figure 15:
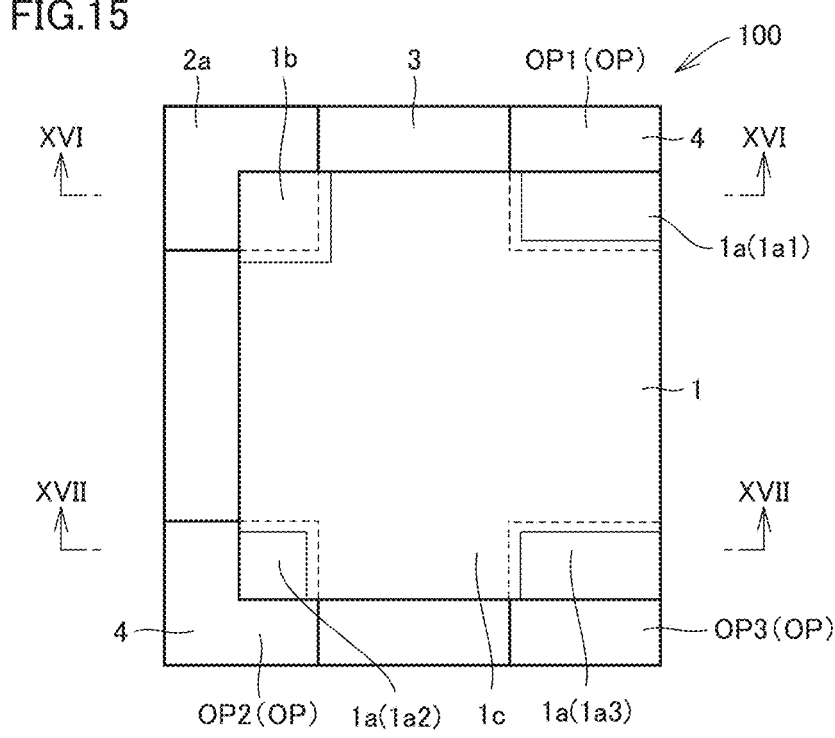
FIG. 15 is a top view schematically showing a configuration of an electromagnetic wave detector according to Embodiment 6.
Figure 16:
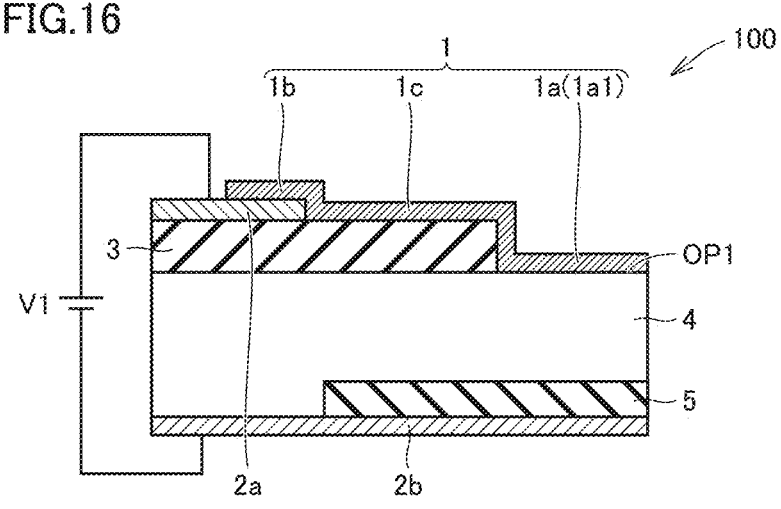
FIG. 16 is a section view in the XVI-XVI line of FIG. 15.
Figure 17:
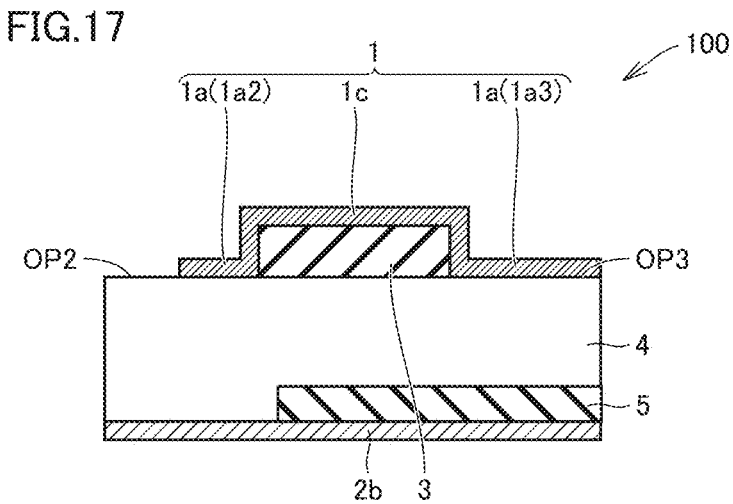
FIG. 17 is a section view in the XVII-XVII line of FIG. 15.

Next, referring to FIGS. 15 to 17, a configuration of electromagnetic wave detector 100 according to Embodiment 6 is described. Embodiment 6 has the same configuration and operation and effect as Embodiment 1 unless otherwise described. Therefore, the same configuration as that in Embodiment 1 is denoted by the same reference numeral, and description thereof is not repeated.

As shown in FIG. 15, in electromagnetic wave detector 100 according to the present embodiment, two-dimensional material layer 1 includes a plurality of first parts 1a. Electromagnetic wave detector 100 according to the present embodiment differs from electromagnetic wave detector 100 according to Embodiment 1 in that two-dimensional material layer 1 includes plurality of first parts 1a. Plurality of first parts 1a are arranged on semiconductor layer 4. Plurality of first parts 1a are arranged at an interval from each other.

In the present embodiment, opening OP includes a first opening region OP1, a second opening region OP2, and a third opening region OP3. First opening region OP1, second opening region OP2 and third opening region OP3 are arranged at an interval from each other. Each of first opening region OP1, second opening region OP2 and third opening region OP3 penetrates insulating film 3. Semiconductor layer 4 is exposed from insulating film 3 in each of first opening region OP1, second opening region OP2 and third opening region OP3. Two-dimensional material layer 1 extends from on insulating film 3 to the inside of each of first opening region OP1, second opening region OP2 and third opening region OP3. Two-dimensional material layer 1 is in contact with semiconductor layer 4 in first opening region OP1, second opening region OP2 and third opening region OP3.

Electromagnetic wave detector 100 is configured as one pixel. For example, electromagnetic wave detector 100 is configured as one pixel having a quadrangular plane shape. It is desired that the area of first electrode portion 2a is as small as possible at the time of incidence of an electromagnetic wave to ferroelectric layer 5. Therefore, first electrode portion 2a is arranged at a first corner among four corners of semiconductor layer 4. Also, first opening region OP1 is arranged at a second corner among four corners of semiconductor layer 4. Second opening region OP2 is arranged from a third corner to a fourth corner among four corners of semiconductor layer 4. As a result, attenuation of electromagnetic wave by first electrode portion 2a is suppressed, and a contact area between two-dimensional material layer 1 and ferroelectric layer 5 increases. Accordingly, the region that is influenced by polarization change (pyroelectric effect) of ferroelectric layer 5 enlarges in two-dimensional material layer 1, so that the sensitivity of electromagnetic wave detector 100 improves. It is desired that the area of first electrode portion 2a and the area of opening OP are as small as possible.

As shown in FIG. 16, a first part 1a1 of plurality of first parts 1a is in contact with semiconductor layer 4 in first opening region OP1. As shown in FIG. 17, a second first part 1a2 of plurality of first parts 1a is in contact with semiconductor layer 4 in second opening region OP2. A third first part 1a3 of plurality of first parts 1a is in contact with semiconductor layer 4 in third opening region OP3.

Figure 18:
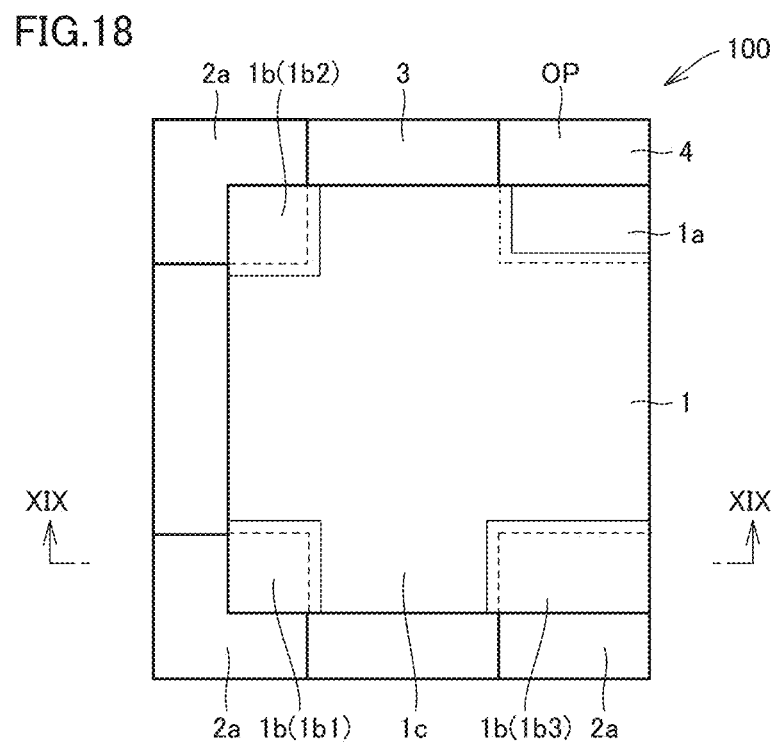
FIG. 18 is a top view schematically showing a configuration of an electromagnetic wave detector according to a modified example of Embodiment 6.
Figure 19:
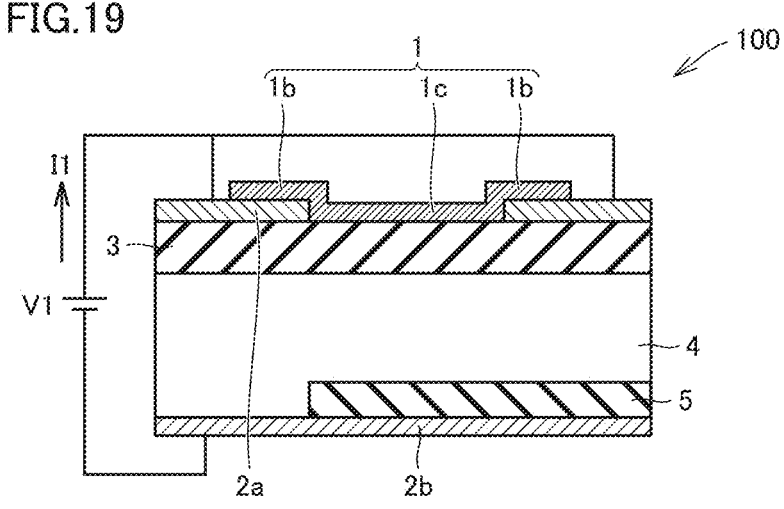
FIG. 19 is a section view schematically showing a configuration of the electromagnetic wave detector according to the modified example of Embodiment 6.

Next, referring to FIGS. 18 and 19, a configuration of electromagnetic wave detector 100 according to a first modified example of Embodiment 6 is described. FIG. 19 is a section view in the XIX-XIX line of FIG. 18.

In electromagnetic wave detector 100 according to the present embodiment, as shown in FIGS. 18 and 19, two-dimensional material layer 1 includes a plurality of second parts 1b. Plurality of second parts 1b are arranged on first electrode portion 2a. Plurality of second parts 1b are arranged at an interval from each other.

Electromagnetic wave detector 100 according to the present embodiment includes three first electrode portions 2a. Two-dimensional material layer 1 include three second parts 1b. Three first electrode portions 2a are arranged at a first to a third corners among four corners of semiconductor layer 4. Also, plurality of second parts 1b include a first second part 1b1, a second second part 1b2 and a third second part 1b3. Each of first second part 1b1, second second part 1b2 and third second part 1b3 are respectively arranged at the first to the third corners.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 15, plurality of first parts 1a are arranged at an interval from each other. Therefore, it is possible to prevent a photo current flowing between first electrode portion 2a and semiconductor layer 4 through plurality of first parts 1a from flowing locally in two-dimensional material layer 1 as compared with the case where first part 1a is single. Also, it is easy to enlarge the contact area between two-dimensional material layer 1 and semiconductor layer 4, as compared with the case where first part 1a is single. Therefore, a photo current flowing in two-dimensional material layer 1 is dispersed. Therefore, the region where a current flows in two-dimensional material layer 1 caused by the pyroelectric effect of ferroelectric layer 5 enlarges. Therefore, the detection sensitivity of electromagnetic wave detector 100 improves.

According to electromagnetic wave detector 100 according to the first modified example of the present embodiment, as shown in FIG. 19, plurality of second parts 1b are arranged at an interval from each other. Therefore, it is possible to prevent a photo current flowing between first electrode portion 2a and semiconductor layer 4 through plurality of second parts 1b from flowing locally in two-dimensional material layer 1 as compared with the case where second part 1b is single. Also, it is easy to enlarge the contact area between two-dimensional material layer 1 and semiconductor layer 4, as compared with the case where second part 1b is single. Therefore, a photo current flowing in two-dimensional material layer 1 is dispersed. Therefore, the region where a current flows in two-dimensional material layer 1 caused by the pyroelectric effect of ferroelectric layer 5 enlarges. Therefore, the detection sensitivity of electromagnetic wave detector 100 improves.

Embodiment 7

Figure 20:
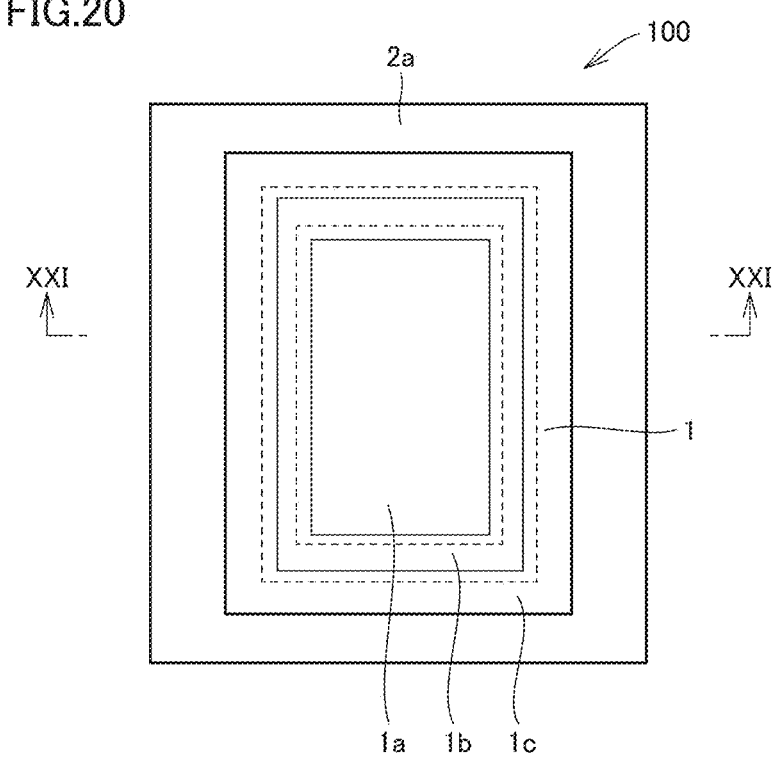
FIG. 20 is a top view schematically showing a configuration of an electromagnetic wave detector according to Embodiment 7.
Figure 21:
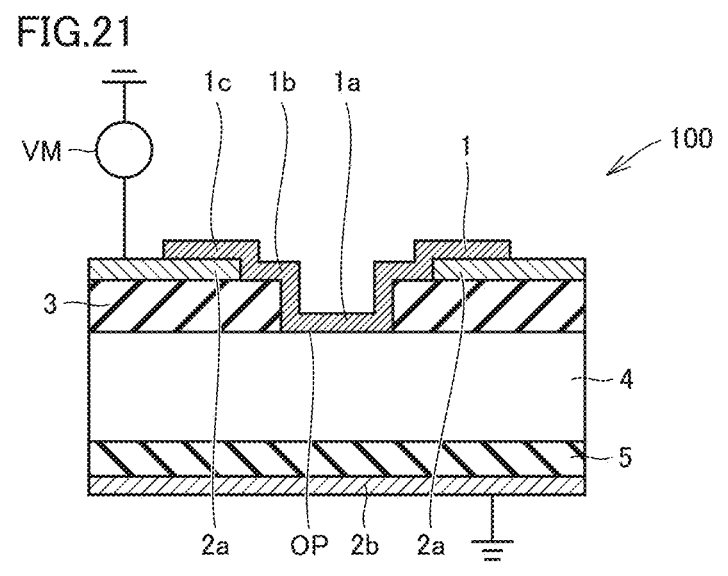

Next, referring to FIGS. 20 and 21, a configuration of electromagnetic wave detector 100 according to Embodiment 7 is described. Embodiment 7 has the same configuration and operation and effect as Embodiment 1 unless otherwise described. Therefore, the same configuration as that in Embodiment 1 is denoted by the same reference numeral, and description thereof is not repeated.

As shown in FIG. 20, first electrode portion 2a has an annular shape in plan view. Semiconductor layer 4 is exposed from insulating film 3 on an inner side than first electrode portion 2a. Two-dimensional material layer 1 is electrically connected to semiconductor layer 4 on an inner side than first electrode portion 2*a*. First electrode portion 2*a* is arranged on the outer circumference of semiconductor layer 4.

As shown in FIG. 21, opening OP is arranged on an inner side than first electrode portion 2*a*. First electrode portion 2*a* is arranged on insulating film 3 such that it surrounds opening OP. First part 1*a* of two-dimensional material layer 1 is electrically connected to semiconductor layer 4 on an inner side than first electrode portion 2*a*. Opening OP is arranged, for example, in the center of semiconductor layer 4.

The configuration of electromagnetic wave detector 100 according to the present embodiment may be applied to other embodiments.

<Operation and Effect>

Subsequently, operation and effect of the present embodiment is described. As shown in FIG. 20, first electrode portion 2*a* has an annular shape in plan view. Therefore, it is possible to enlarge the region that is influenced by change in electric field from semiconductor layer 4 in two-dimensional material layer 1 while suppressing attenuation of electromagnetic wave by first electrode portion 2*a* to the minimum. Therefore, the sensitivity of electromagnetic wave detector 100 improves.

Embodiment 8

Figure 22:
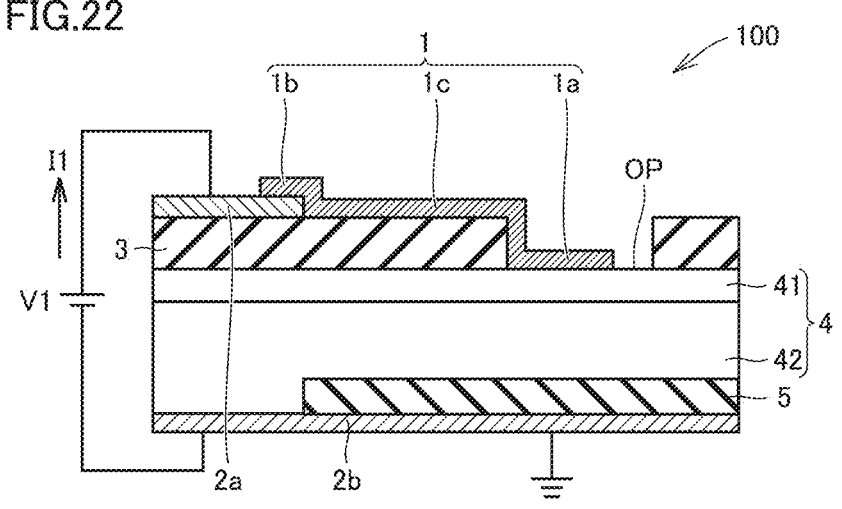
FIG. 22 is a section view schematically showing a configuration of an electromagnetic wave detector according to Embodiment 8.

Next, referring to FIG. 22, a configuration of electromagnetic wave detector 100 according to Embodiment 8 is described. Embodiment 8 has the same configuration and operation and effect as Embodiment 1 unless otherwise described. Therefore, the same configuration as that in Embodiment 1 is denoted by the same reference numeral, and description thereof is not repeated.

As shown in FIG. 22, in electromagnetic wave detector 100 according to the present embodiment, semiconductor layer 4 includes a first semiconductor part 41 and a second semiconductor part 42. Electromagnetic wave detector 100 according to the present embodiment differs from electromagnetic wave detector 100 according to Embodiment 1 in that semiconductor layer 4 includes first semiconductor part 41 and second semiconductor part 42. Semiconductor layer 4 may further include an unillustrated third semiconductor part. First semiconductor part 41 is joined with second semiconductor part 42. First semiconductor part 41 is joined with second semiconductor part 42 by pn junction. Therefore, pn-junction is formed inside semiconductor layer 4.

First semiconductor part 41 is exposed from insulating film 3 in opening OP. First semiconductor part 41 is electrically connected to first electrode portion 2*a* with two-dimensional material layer 1 interposed therebetween. First semiconductor part 41 is in contact with two-dimensional material layer 1 and insulating film 3. Second semiconductor part 42 is arranged opposite to two-dimensional material layer 1 with respect to first semiconductor part 41. Second semiconductor part 42 is electrically connected to second electrode portion 2*b*. In FIG. 22, second semiconductor part 42 is laminated on first semiconductor part 41, however, the positional relationship between first semiconductor part 41 and second semiconductor part 42 is not limited to this.

Second semiconductor part 42 has a conductive type that is different from that of first semiconductor part 41. First semiconductor part 41 has a first conductive type. Second semiconductor part 42 has a second conductive type. The first conductive type is an opposite conductive type to the second conductive type. For example, when the conductive type of first semiconductor part 41 is n-type, the conductive type of the second semiconductor part 42 is p-type. Thus, semiconductor layer 4 is configured as a diode.

Second semiconductor part 42 may have an absorption wavelength that is different from that of first semiconductor part 41. Semiconductor layer 4 may be formed as a diode having sensitivity at a wavelength that is different from that of ferroelectric layer 5. Also, first semiconductor part 41 and second semiconductor part 42 may be configured as a diode having sensitivity at a wavelength that is different from that of ferroelectric layer 5.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 22, first semiconductor part 41 is joined with second semiconductor part 42. Therefore, pn-junction is formed inside semiconductor layer 4. Thus, semiconductor layer 4 is configured as a diode. Therefore, it is possible to prevent a dark current from flowing in semiconductor layer 4.

When first semiconductor part 41 and second semiconductor part 42 are configured as a diode having sensitivity at a wavelength different from that of ferroelectric layer 5, the wavelength detectable by electromagnetic wave detector 100 is a wavelength that is detectable by each of first semiconductor part 41, second semiconductor part 42 and ferroelectric layer 5. Therefore, electromagnetic wave detector 100 is capable of detecting a broad band of wavelengths.

Embodiment 9

Figure 23:
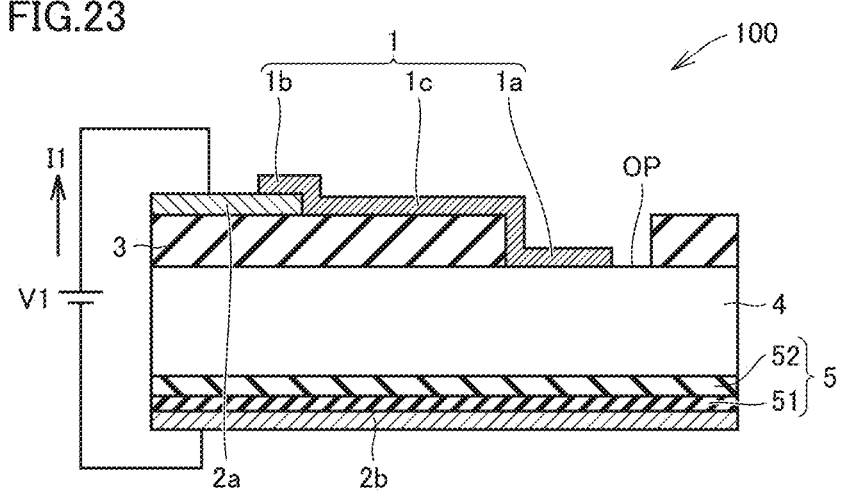
FIG. 23 is a section view schematically showing a configuration of an electromagnetic wave detector according to Embodiment 9.

Next, referring to FIG. 23, a configuration of electromagnetic wave detector 100 according to Embodiment 9 is described. Embodiment 9 has the same configuration and operation and effect as Embodiment 1 unless otherwise described. Therefore, the same configuration as that in Embodiment 1 is denoted by the same reference numeral, and description thereof is not repeated.

As shown in FIG. 23, in electromagnetic wave detector 100 according to the present embodiment, ferroelectric layer 5 includes a first ferroelectric part 51 and a second ferroelectric part 52. Electromagnetic wave detector 100 according to the present embodiment differs from electromagnetic wave detector 100 according to Embodiment 1 in that ferroelectric layer 5 includes first ferroelectric part 51 and second ferroelectric part 52. Each of first ferroelectric part 51 and second ferroelectric part 52 is electrically connected to two-dimensional material layer 1 and semiconductor layer 4.

First ferroelectric part 51 is arranged in contact with any one of semiconductor layer 4, first electrode portion 2*a* and second electrode portion 2*b*. In the present embodiment, first ferroelectric part 51 is arranged on second electrode portion 2*b*. Second ferroelectric part 52 is arranged opposite to second electrode portion 2*b* with respect to first ferroelectric part 51, on first ferroelectric part 51. Therefore, first ferroelectric part 51 and second ferroelectric part 52 are laminated. The arrangement of first ferroelectric part 51 and second ferroelectric part 52 is not limited to this.

It is only required that a material of first ferroelectric part 51 and second ferroelectric part 52 is a ferroelectric substance in which polarization changes with the change in thermal energy. A wavelength of electromagnetic wave that can be absorbed by first ferroelectric part 51 is different from a wavelength of electromagnetic wave that can be absorbed by second ferroelectric part 52.

Figure 24:
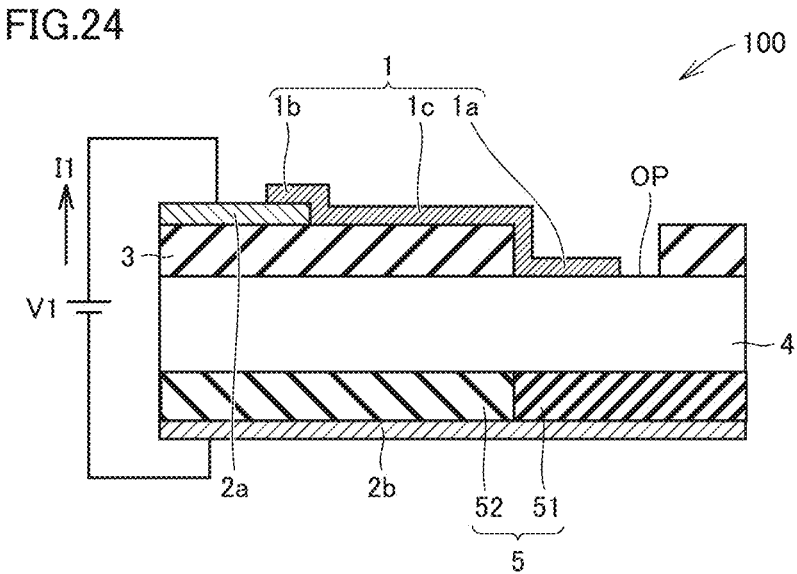
FIG. 24 is a section view schematically showing a configuration of an electromagnetic wave detector according to a first modified example of Embodiment 9.

Next, referring to FIG. 24, a configuration of a first modified example of electromagnetic wave detector 100 according to Embodiment 9 is described.

As shown in FIG. 24, in electromagnetic wave detector 100 according to the present embodiment, first ferroelectric part 51 and second ferroelectric part 52 are placed side by side along the in-plane direction of semiconductor layer 4. First ferroelectric part 51 and second ferroelectric part 52 are arranged in regions that are different from each other on any one of semiconductor layer 4, first electrode portion 2a and second electrode portion 2b.

A modified example of the present embodiment is different from electromagnetic wave detector 100 shown in FIG. 23 in that first ferroelectric part 51 and second ferroelectric part 52 are arranged in regions that are different from each other.

First ferroelectric part 51 is arranged to be overlapped with first part 1a of two-dimensional material layer 1 in plan view. Second ferroelectric part 52 is arranged to be overlapped with second part 1b and third part 1c of two-dimensional material layer 1 in plan view.

Polarizability of first ferroelectric part 51 is different from polarizability of second ferroelectric part 52. For example, polarizability of first ferroelectric part 51 is higher than polarizability of second ferroelectric part 52. Polarizabilities of first ferroelectric part 51 and second ferroelectric part 52 are designed so that the Fermi level of each of first part 1a, second part 1b and third part 1c of two-dimensional material layer 1 is optimum.

Figure 25:
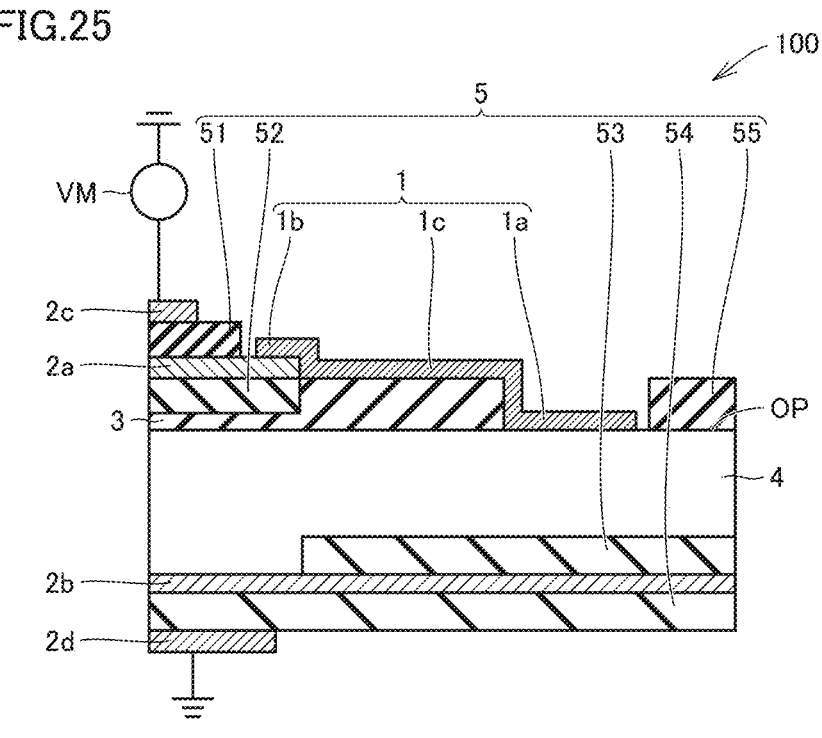
FIG. 25 is a section view schematically showing a configuration of an electromagnetic wave detector according to a second modified example of Embodiment 9.

Next, referring to FIG. 25, a configuration of a second modified example of electromagnetic wave detector 100 according to Embodiment 9 is described.

As shown in FIG. 25, ferroelectric layer 5 includes first ferroelectric part 51, second ferroelectric part 52, a third ferroelectric part 53, a fourth ferroelectric part 54 and a fifth ferroelectric part 55. Electromagnetic wave detector 100 includes third electrode portion 2c and a fourth electrode portion 2d. First ferroelectric part 51 is sandwiched between first electrode portion 2a and third electrode portion 2c. Second ferroelectric part 52 is sandwiched between first electrode portion 2a and insulating film 3. Third ferroelectric part 53 is sandwiched between second electrode portion 2b and semiconductor layer 4. Fourth ferroelectric part 54 is sandwiched between second electrode portion 2b and fourth electrode portion 2d. Fifth ferroelectric part 55 is arranged on semiconductor layer 4 in opening OP. Preferably, polarization direction of each of first ferroelectric part 51, second ferroelectric part 52, third ferroelectric part 53, fourth ferroelectric part 54 and fifth ferroelectric part 55 is along the direction in which bias voltage is applied to electromagnetic wave detector 100.

The arrangement of first ferroelectric part 51, second ferroelectric part 52, third ferroelectric part 53, fourth ferroelectric part 54 and fifth ferroelectric part 55 is not limited to the above arrangement.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 23, ferroelectric layer 5 includes first ferroelectric part 51 and second ferroelectric part 52. Therefore, it is possible to easily increase the volume of ferroelectric layer 5 as compared with the case where ferroelectric layer 5 is made up of only one ferroelectric part. Polarization change of ferroelectric layer 5 increases with the volume of ferroelectric layer 5. Therefore, the sensitivity of electromagnetic wave detector 100 improves. Also, since the ferroelectric parts are arranged at a plurality of sites, attenuation of the detection signal in the current path of electromagnetic wave detector 100 decreases. Therefore, the sensitivity of electromagnetic wave detector 100 improves.

A wavelength of electromagnetic wave that can be absorbed by first ferroelectric part 51 is different from a wavelength of electromagnetic wave that can be absorbed by second ferroelectric part 52. Therefore, electromagnetic wave detector 100 is capable of detecting wavelengths of a broad band, compared with the case where the wavelengths of electromagnetic wave that can be absorbed by first ferroelectric part 51 and second ferroelectric part 52 are the same.

According to electromagnetic wave detector 100 according to a first modified example of the present embodiment, as shown in FIG. 24, polarizability of first ferroelectric part 51 is different from polarizability of second ferroelectric part 52. First ferroelectric part 51 is electrically connected to first part 1a of two-dimensional material layer 1. Second ferroelectric part 52 is electrically connected to second part 1b and third part 1c of two-dimensional material layer 1. Therefore, Fermi levels of first ferroelectric part 51 and second ferroelectric part 52 can be designed so that the Fenni level in each of first part 1a, second part 1b and third part 1c of two-dimensional material layer 1 is optimum. Therefore, the sensitivity of electromagnetic wave detector 100 improves.

According to electromagnetic wave detector 100 according to a second modified example of the present embodiment, as shown in FIG. 25, ferroelectric layer 5 includes first ferroelectric part 51, second ferroelectric part 52, third ferroelectric part 53, fourth ferroelectric part 54 and fifth ferroelectric part 55. Therefore, the volume of ferroelectric layer 5 increases as compared with the case where ferroelectric layer 5 is made up of only first ferroelectric part 51 and second ferroelectric part 52. Therefore, the polarization change of ferroelectric layer 5 further increases. Therefore, the sensitivity of electromagnetic wave detector 100 further improves.

Embodiment 10

Figure 26:
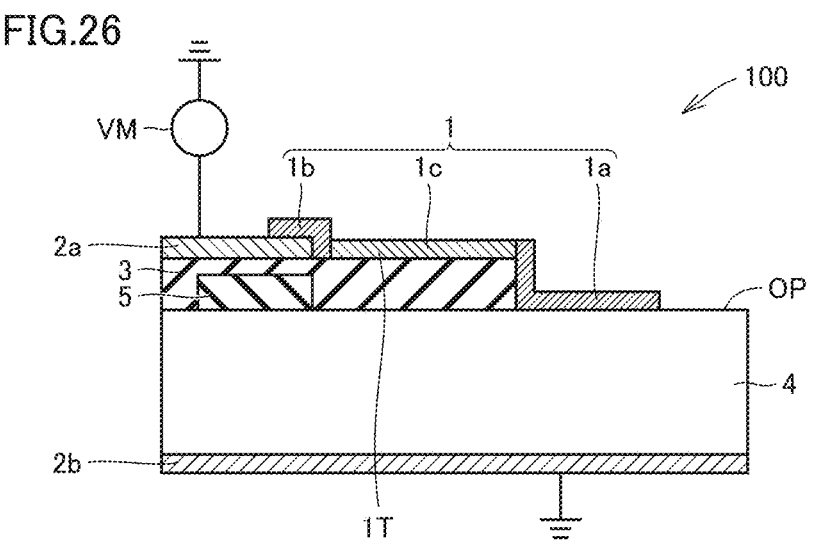
FIG. 26 is a section view schematically showing a configuration of an electromagnetic wave detector according to Embodiment 10.

Next, referring to FIG. 26, a configuration of electromagnetic wave detector 100 according to Embodiment 10 is described. Embodiment 10 has the same configuration and operation and effect as Embodiment 1 unless otherwise described. Therefore, the same configuration as that in Embodiment 1 is denoted by the same reference numeral, and description thereof is not repeated.

As shown in FIG. 26, in electromagnetic wave detector 100 according to the present embodiment, two-dimensional material layer 1 includes a turbostratic structure part 1T. Electromagnetic wave detector 100 according to the present embodiment differs from electromagnetic wave detector 100 according to Embodiment 1 in that two-dimensional material layer 1 includes turbostratic structure part 1T. Turbostratic structure part 1T is a structure in which a plurality of graphene layers are laminated in the state that respective lattices of the plurality of graphene layers are mismatched. Two-dimensional material layer 1 may include turbostratic structure part 1T as a part of two-dimensional material layer 1, or the entire two-dimensional material layer 1 may be configured by turbostratic structure part 1T. The material of two-dimensional material layer 1 according to the present embodiment is multilayer graphene.

In FIG. 26, third part 1c of two-dimensional material layer 1 is formed of turbostratic structure part 1T. In other words, graphene of turbostratic structure is applied only to the part of two-dimensional material layer 1 arranged on insulating film 3. Also, first part 1a and second part 1b of two-dimensional material layer 1 need not include turbostratic structure part 1T. In other words, the part of two-dimensional material layer 1 arranged on first electrode portion 2a and on semiconductor layer 4 need not include turbostratic structure part 1T. First part 1a and second part 1b may be formed of, for example, monolayer graphene. When first part 1a and second part 1b are formed of monolayer graphene, and third part 1c includes turbostratic structure part 1T, it is possible to prevent contact resistance between two-dimensional material layer 1 and first electrode portion 2a, and contact resistance between two-dimensional material layer 1 and semiconductor layer 4 from increasing, and it is possible to suppress carrier scattering by insulating film 3 for two-dimensional material layer 1. Although not illustrated, first part 1a and second part 1b of two-dimensional material layer 1 may be turbostratic structure part 1T.

A method for preparing turbostratic structure part 1T may be appropriately determined. For example, turbostratic structure part 1I may be formed by transferring monolayer graphene prepared by the CVD method several times to laminate into multilayer graphene. Also, turbostratic structure part 1T may be formed by arranging a carbon source such as ethanol, methane or the like on graphene, and growing the graphene by the CVD method.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 26, two-dimensional material layer 1 includes turbostratic structure part 1T. Therefore, it is possible to improve the mobility of carrier in two-dimensional material layer 1. Therefore, it is possible to improve the sensitivity of electromagnetic wave detector 100.

More specifically, normal multilayer graphene that does not include turbostratic structure part 1T is laminated in the state that respective lattices of plurality of graphenes are matched. This state is called A-B multilayer. Meanwhile, multilayer graphene including turbostratic structure part 1T is formed in the following manner. Graphene prepared by the CVD method has polycrystals. Therefore, when graphene is further transferred on the graphene plural times, or when graphene is further laminated by the CVD method with the underlying graphene being as a core, lamination is performed in the state that respective lattices of plurality of graphenes are mismatched. That is, turbostratic structure part 1T is formed in graphene. Graphene of the turbostratic structure constituting turbostratic structure part 1T is less influenced by the interaction between layers, and has the equivalent properties as monolayer graphene. Further, in two-dimensional material layer 1, the mobility deteriorates due to the influence of photo carrier scattering in underlying insulating film 3. However, in turbostratic structure part 1T, the graphene being in contact with the insulating film 3 is influenced by photo carrier scattering, but the graphene of the upper layer laminated in the turbostratic structure on the graphene is less likely to be influenced by photo carrier scattering of the underlying insulating film 3. Also, in the graphene of the turbostratic structure, since the influence of the interaction between layers is small, the conductivity also improves. Based on the above, the mobility of photo carrier improves in the graphene of the turbostratic structure. As a result, the sensitivity of electromagnetic wave detector 100 improves.

Embodiment 11

Figure 27:
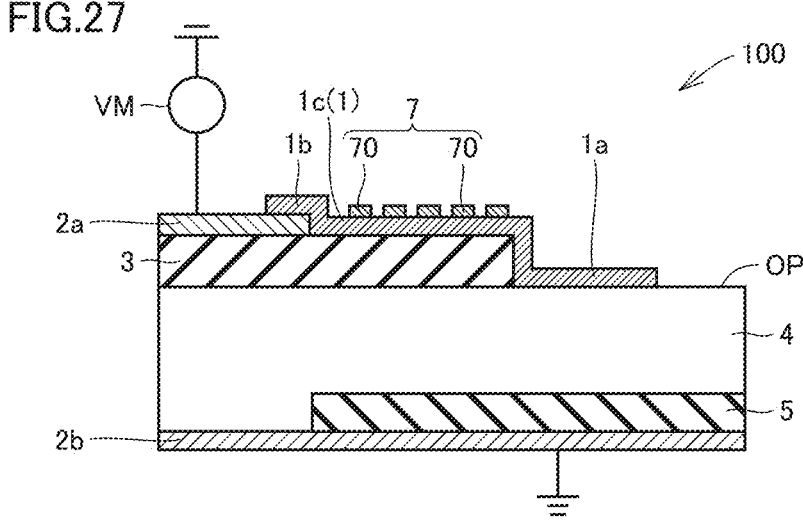
FIG. 27 is a section view schematically showing a configuration of an electromagnetic wave detector according to Embodiment 11.
Figure 28:
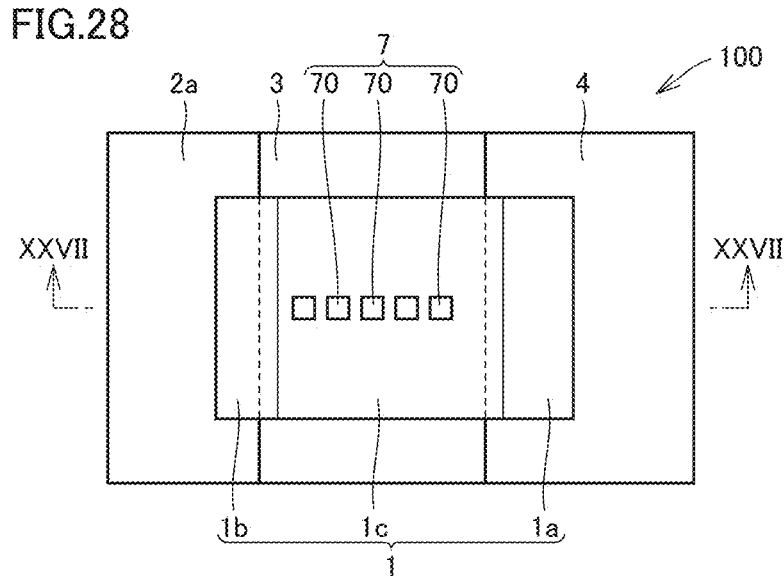
FIG. 28 is a top view schematically showing a configuration of the electromagnetic wave detector according to Embodiment 11.

Next, referring to FIGS. 27 and 28, a configuration of electromagnetic wave detector 100 according to Embodiment 11 is described. Embodiment 11 has the same configuration and operation and effect as Embodiment 1 unless otherwise described. Therefore, the same configuration as that in Embodiment 1 is denoted by the same reference numeral, and description thereof is not repeated. FIG. 27 is a section view in the XXVII-XXVII line of FIG. 28.

As shown in FIG. 27, electromagnetic wave detector 100 according to the present embodiment further includes a conductor 7. Electromagnetic wave detector 100 according to the present embodiment differs from electromagnetic wave detector 100 according to Embodiment 1 in that electromagnetic wave detector 100 further includes conductor 7. Conductor 7 is arranged so as to be contact with two-dimensional material layer 1. Conductor 7 is not connected to a power circuit or the like. That is, conductor 7 is configured as a floating electrode. A material of conductor 7 may be appropriately determined among materials that conduct electricity. Examples of the material of conductor 7 include metal materials such as gold (Au), silver (Ag), copper (Cu), aluminum (Al), nickel (Ni), chromium (Cr), and palladium (Pd). The material of conductor 7 is preferably, a material that generates surface plasmon resonance in conductor 7.

A method for forming conductor 7 may be appropriately determined. The method for forming conductor 7 may be the same as the production method of first electrode portion 2a described in Embodiment 1.

In the present embodiment, conductor 7 includes a plurality of conductive parts 70. Plurality of conductive parts 70 are arranged at an interval from each other. The material of conductive part 70 is preferably, a material that generates surface plasmon resonance in conductive part 70. Each of conductive parts 70 is configured as a floating electrode.

In the present embodiment, plurality of conductive parts 70 have a one-dimensional (see FIG. 28) or two-dimensional (see FIG. 29) periodical structure. Among plurality of conductive parts 70, neighboring conductive parts 70 are preferably arranged at such an interval that surface plasmon resonance is generated in each of plurality of conductive parts 70.

As shown in FIG. 28, plurality of conductive parts 70 may have a one-dimensional periodical structure. Among plurality of conductive parts 70, neighboring conductive parts 70 are arranged at regular intervals along the first direction.

Figure 29:
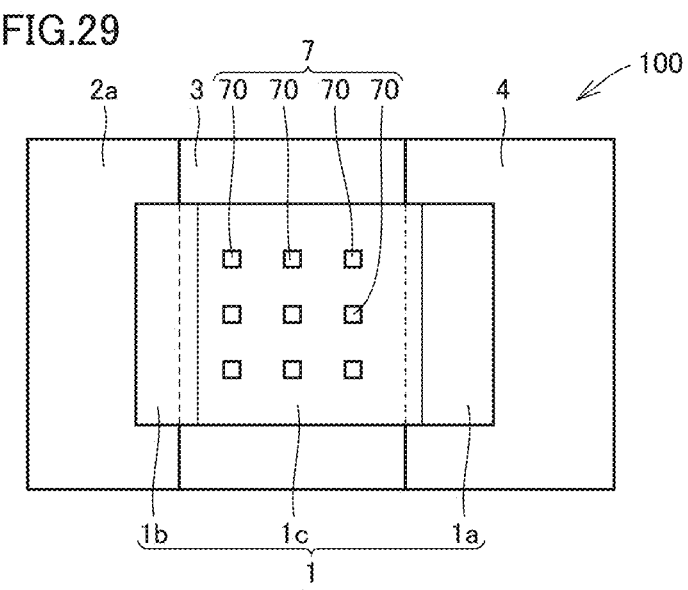
FIG. 29 is a top view schematically showing a configuration of an electromagnetic wave detector according to a first modified example of Embodiment 11.

As shown in FIG. 29, plurality of conductive parts 70 may have a two-dimensional periodical structure. Among plurality of conductive parts 70, neighboring conductive parts 70 are arranged at regular intervals along the first direction and the second direction. The second direction intersects with the first direction. In FIG. 29, plurality of conductive parts 70 are arranged at positions corresponding to lattice points of tetragonal lattice. Plurality of conductive parts 70 may be arranged, for example, at positions corresponding to lattice points of triangular lattice. Although not illustrated, the arrangement of plurality of conductive parts 70 is not limited to a periodically symmetric arrangement. Also, the arrangement of plurality of conductive parts 70 may be an asymmetric arrangement in plan view. In FIGS. 28 and 29, the plane form of plurality of conductive parts 70 is a quadrangle, but the form of plurality of conductive parts 70 is not limited to this. The plane form of plurality of conductive parts 70 may be, for example, a circle, or a polygon such as triangle, or may be an oval shape and the like.

Figure 30:
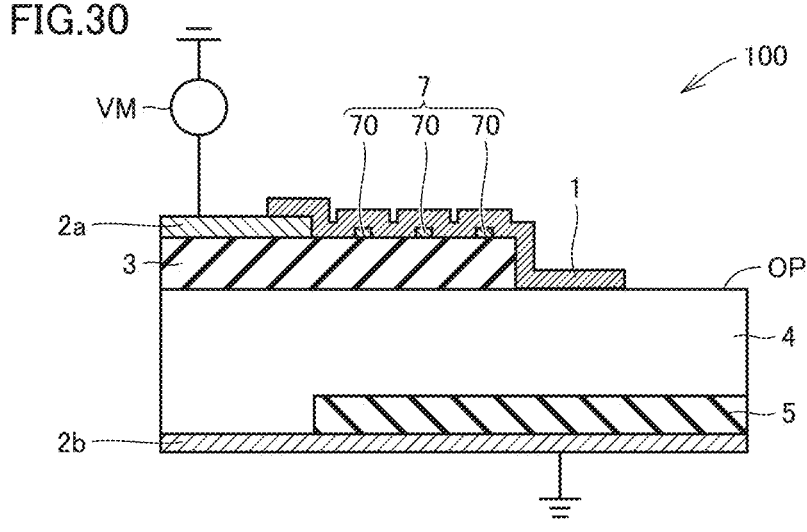
FIG. 30 is a section view schematically showing a configuration of an electromagnetic wave detector according to a second modified example of Embodiment 11.

Also, as shown in FIG. 30, plurality of conductive parts 70 may be arranged between two-dimensional material layer 1 and semiconductor layer 4. Although not illustrated, two-dimensional material layer 1 may include a plurality of recesses or a plurality of protrusions. The plurality of recesses may have a periodical structure or an asymmetrical structure. The plurality of protrusions may have a periodical structure or an asymmetrical structure.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 27, conductor 7 is arranged so as to be in contact with two-dimensional material layer 1. Therefore, the photo carrier generated by application of electromagnetic wave in ferroelectric layer 5 can migrate through conductor 7. The life span of photo carrier in conductor 7 is longer than the life span of photo carrier in two-dimensional material layer 1. Therefore, migration of the photo carrier through conductor 7 elongates the life span of the photo carrier. Therefore, the sensitivity of electromagnetic wave detector 100 improves.

As shown in FIG. 27, conductor 7 includes plurality of conductive parts 70. Plurality of conductive parts 70 are arranged at an interval from each other. Further as shown in FIG. 28, among plurality of conductive parts 70, neighboring conductive parts 70 are arranged at regular intervals along the first direction. Also, the material of conductive part 70 is a material that generates surface plasmon resonance in conductive part 70. Therefore, electromagnetic wave detector 100 is capable of detecting only an electromagnetic wave having polarization that generates surface plasmon resonance in conductive part 70. That is, polarization dependency arises in plurality of conductive parts 70 according to the electromagnetic wave applied to electromagnetic wave detector 100.

As shown in FIG. 29, among plurality of conductive parts 70, neighboring conductive parts 70 are arranged at regular intervals along the first direction and the second direction. Also, the material of conductive part 70 is a material that generates surface plasmon resonance in conductive part 70. Therefore, electromagnetic wave detector 100 is capable of detecting only an electromagnetic wave having a wavelength that generates surface plasmon resonance in conductive part 70 with high sensitivity.

As shown in FIG. 30, plurality of conductive parts 70 are arranged between two-dimensional material layer 1 and semiconductor layer 4. Therefore, two-dimensional material layer 1 covers plurality of conductive parts 70. Accordingly, there is no need to form plurality of conductive parts 70 on two-dimensional material layer 1. Therefore, it is possible to prevent two-dimensional material layer 1 from being injured in formation of plurality of conductive parts 70. Therefore, it is possible to prevent mobility of photo carrier from deteriorating in two-dimensional material layer 1.

Although not illustrated, the arrangement of plurality of conductive parts 70 may be an asymmetric arrangement in plan view. In this case, electromagnetic wave detector 100 is capable of detecting only an electromagnetic wave having polarization that generates surface plasmon resonance in conductive part 70.

Although not illustrated, two-dimensional material layer 1 may include a plurality of recesses or protrusions. Plurality of recesses or protrusions are arranged at such an interval that surface plasmon resonance is generated. Since two-dimensional material layer 1 has high conductivity, surface plasmon resonance is generated in two-dimensional material layer 1. Therefore, likewise the surface plasmon resonance by plurality of conductive parts 70 as described above, surface plasmon resonance is generated in two-dimensional material layer 1 by plurality of recesses or protrusions. Therefore, electromagnetic wave detector 100 is capable of detecting only an electromagnetic wave having polarization or frequency that generates surface plasmon resonance in two-dimensional material layer 1.

Embodiment 12

Figure 31:
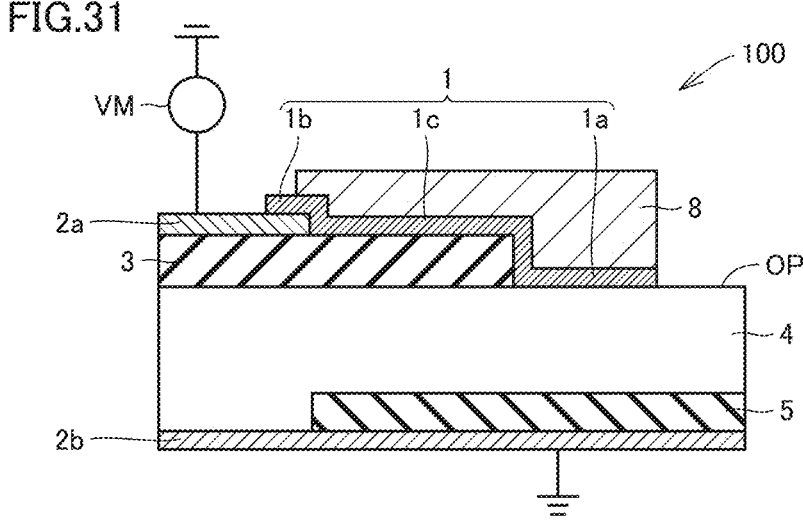
FIG. 31 is a section view schematically showing a configuration of an electromagnetic wave detector according to Embodiment 12.

Next, by referring to FIG. 31, a configuration of electromagnetic wave detector 100 according to Embodiment 12 is described. Unless otherwise described, Embodiment 12 has the same configuration and effect as above Embodiment 1. Therefore, the same configuration as that in Embodiment 1 is denoted by the same reference numeral, and description thereof is not repeated.

As shown in FIG. 31, electromagnetic wave detector 100 according to the present embodiment further includes a contact layer 8. Electromagnetic wave detector 100 according to the present embodiment differs from electromagnetic wave detector 100 according to Embodiment 1 in that electromagnetic wave detector 100 further includes contact layer 8. Contact layer 8 is arranged so as to be contact with two-dimensional material layer 1. Contact layer 8 is in contact with each of first part 1a, second part 1b and third part 1c of two-dimensional material layer 1. Contact layer 8 is configured to supply two-dimensional material layer 1 with holes or electrons (photo carrier) by coming into contact with two-dimensional material layer 1. That is, contact layer 8 is configured to dope two-dimensional material layer 1 with holes or electrons.

Although not illustrated, contact layer 8 may be formed only on the surface of either first part 1a or second part 1b. As a result, gradient of charge density is formed inside two-dimensional material layer 1. Accordingly, the mobility of photo carrier inside two-dimensional material layer 1 improves and the sensitivity of electromagnetic wave detector 100 improves.

Although not illustrated, contact layer 8 may include a plurality of contact parts. The plurality of contact parts may be laminated on two-dimensional material layer 1. The plurality of contact parts may be laminated on two-dimensional material layer 1 between two-dimensional material layer 1 and first electrode portion 2a. Respective materials of the plurality of contact parts may be the same or different from each other.

The material of contact layer 8 is, for example, a positive-type photoresist. A positive-type photoresist is a composition containing a photosensitizer having a quinone diazide group, and novolac resin. The material of contact layer 8 may be for example, a material having a polar group. More specifically, the material of contact layer 8 may be a material having an electron-attracting group, which is one example of the material having a polar group. The material having an electron-attracting group has the effect of reducing the electron density of two-dimensional material layer 1. Examples of the material having an electron-attracting group include materials having a halogen, nitrile, carboxyl group, carbonyl group and the like. Also, the material of contact layer 8 may be, for example, a material having an electron-donating group, which is one example of the material having a polar group. The material having an electron-donating group has the effect of increasing the electron density of two-dimensional material layer 1. Examples of the material having an electron donating group include materials having an alkyl group, alcohol, amino acid, hydroxy group and the like. The material of contact layer 8 may be an organic substance, metal, a semiconductor, an insulator, a two-dimensional material or a mixture of any of these materials as long as polarization of charges occurs and polarity is generated in the entire molecule.

When the material of contact layer 8 is an inorganic substance, two-dimensional material layer 1 is doped to p-type if the work function of contact layer 8 is larger than the work function of two-dimensional material layer 1. When the material of contact layer 8 is an inorganic substance, two-dimensional material layer 1 is doped to n-type if the work function of contact layer 8 is smaller than the work function of two-dimensional material layer 1. When the material of contact layer 8 is an organic substance, the organic substance does not have a definite work function. Therefore, it is desired to determine to which one of n-type and p-type two-dimensional material layer 1 is to be doped by determining the polar group of the material of contact layer 8 according to the polarity of the molecule of the organic substance constituting the material of contact layer 8.

For example, when a positive-type photoresist is used as contact layer 8, the region where a resist is formed by photolithography step in two-dimensional material layer 1 becomes p-type two-dimensional material layer 1 region. Accordingly, the treatment of forming a mask contacting on the surface of two-dimensional material layer 1 is no longer required. As a result, it is possible to suppress injury of two-dimensional material layer 1 by the process of forming a mask. Also, it is possible to simplify the process.

The material of contact layer 8 may be a material in which polarity conversion occurs by application of an electromagnetic wave to contact layer 8. By occurrence of polarity conversion in contact layer 8, electrons or holes generated at the time of polarity conversion are supplied to two-dimensional material layer 1. Therefore, the part of two-dimensional material layer 1 being in contact with contact layer 8 is doped with electrons or holes. Therefore, after removal of contact layer 8, the part of two-dimensional material layer 1 having been in contact with contact layer 8 remains in the condition it is doped with electrons or holes. Therefore, when a material in which polarity conversion occurs is used as the material of contact layer 8, contact layer 8 may be removed from on two-dimensional material layer 1 after occurrence of polarity conversion. The area of the open part of two-dimensional material layer 1 increases compared with the case where contact layer 8 is arranged. Therefore, it is possible to improve the detection sensitivity of electromagnetic wave detector 100. Polarity conversion is a phenomenon that a polar group chemically converts, and means, for example, the phenomenon such as conversion from an electron-attracting group to an electron-donating group, conversion from an electron-donating group to an electron-attracting group, conversion from a polar group to a non-polar group, or conversion from a non-polar group to a polar group.

By selecting a material in which polarity conversion occurs at a detection wavelength as the material of contact layer 8, polarity conversion occurs in contact layer 8 only when an electromagnetic wave having the detection wavelength is applied. Accordingly, doping to two-dimensional material layer 1 is conducted only when an electromagnetic wave having a detection wavelength is applied. As a result, it is possible to increase the photo current flowing into two-dimensional material layer 1.

Also, the material of contact layer 8 may be a material in which oxidation-reduction reaction occurs by application of an electromagnetic wave to contact layer 8. Accordingly, it is possible to dope two-dimensional material layer 1 with electrons or holes generated when oxidation-reduction reaction occurs in contact layer 8.

It is preferred that the film thickness of contact layer 8 is small enough to conduct photoelectric conversion when an electromagnetic wave is applied to two-dimensional material layer 1. On the other hand, it is preferred that contact layer 8 is formed to have such a degree of thickness that a photo carrier is doped to two-dimensional material layer 1 from contact layer 8.

Configuration of contact layer 8 may be appropriately determined as long as a photo carrier such as a molecule or an electron is supplied to two-dimensional material layer 1. For example, by dipping two-dimensional material layer 1 in a solution, and supplying two-dimensional material layer 1 with a photo carrier in a molecular level, two-dimensional material layer 1 may be doped with the photo carrier without formation of solid contact layer 8 on two-dimensional material layer 1.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 31, contact layer 8 is arranged so as to be in contact with two-dimensional material layer 1. Contact layer 8 is configured to supply two-dimensional material layer 1 with holes or electrons by coming into contact with two-dimensional material layer 1. Therefore, the conductive type of two-dimensional material layer 1 can be an n-type or a p-type. Accordingly, even when a photo carrier is doped from first electrode portion 2a, semiconductor layer 4 and ferroelectric layer 5 to two-dimensional material layer 1, the conductive type of two-dimensional material layer 1 can be controlled by contact layer 8. Therefore, it is possible to improve the performance of electromagnetic wave detector 100.

Embodiment 13

Figure 32:
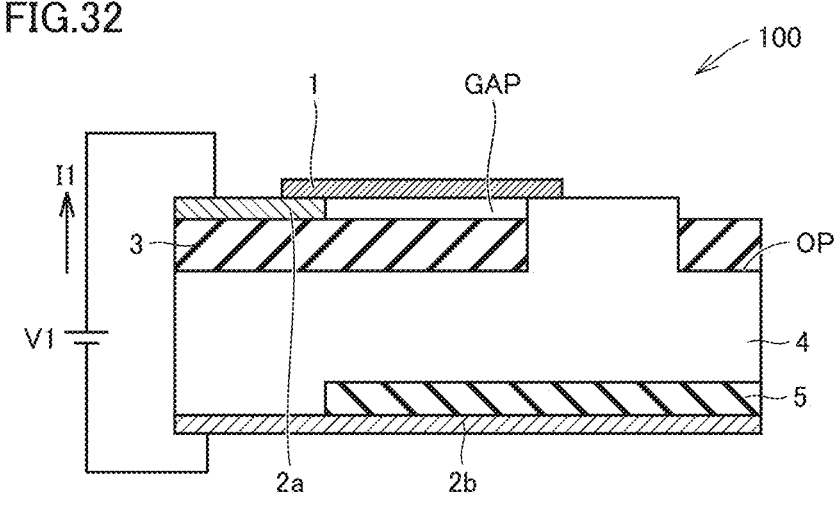
FIG. 32 is a section view schematically showing a configuration of an electromagnetic wave detector according to Embodiment 13.

Next, by referring to FIG. 32, a configuration of electromagnetic wave detector 100 according to Embodiment 13 is described. Unless otherwise described, Embodiment 13 has the same configuration and effect as above Embodiment 1. Therefore, the same configuration as that in Embodiment 1 is denoted by the same reference numeral, and description thereof is not repeated.

As shown in FIG. 32, in electromagnetic wave detector 100 according to the present embodiment, a gap GAP is provided between insulating film 3 and two-dimensional material layer 1. Two-dimensional material layer 1 has a surface facing gap GAP. That is, unlike electromagnetic wave detector 100 according to Embodiment 1, two-dimensional material layer 1 has a part arranged apart from insulating film 3. In opening OP, it is preferred that the height position of the surface of semiconductor layer 4 is the same as the height position of the surface of first electrode portion 2a. Gap GAP is provided between first electrode portion 2a and semiconductor layer 4. Two-dimensional material layer 1 extends from on first electrode portion 2a to on semiconductor layer 4 while bridging gap GAP. Other configuration may be employed as long as gap GAP is provided between two-dimensional material layer 1 and the insulating layer.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 32, gap GAP is provided between insulating film 3 and two-dimensional material layer 1. Therefore, it is possible to remove the influence of scattering of carrier associated with the contact between insulating film 3 and two-dimensional material layer 1. As a result, it is possible to suppress deterioration in mobility of carrier in two-dimensional material layer 1. Therefore, it is possible to improve the sensitivity of electromagnetic wave detector 100.

Embodiment 14

Figure 33:
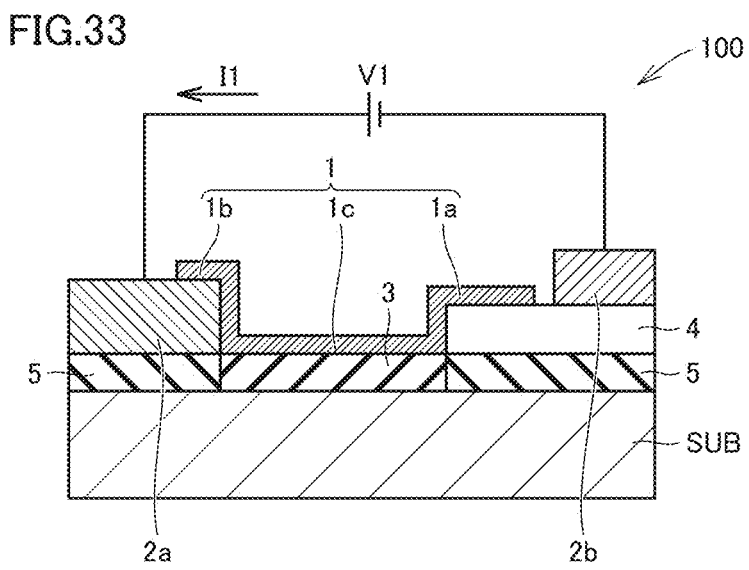
FIG. 33 is a section view schematically showing a configuration of an electromagnetic wave detector according to Embodiment 14.

Next, by referring to FIG. 33, a configuration of electromagnetic wave detector 100 according to Embodiment 14 is described. Unless otherwise described, Embodiment 14 has the same configuration and effect as above Embodiment 1. Therefore, the same configuration as that in Embodiment 1 is denoted by the same reference numeral, and description thereof is not repeated.

Electromagnetic wave detector 100 according to the present embodiment further includes a substrate portion SUB as shown in FIG. 33. Electromagnetic wave detector 100 according to the present embodiment differs from electromagnetic wave detector 100 according to Embodiment 1 in that electromagnetic wave detector 100 further includes substrate portion SUB. Two-dimensional material layer 1, first electrode portion 2a, first electrode portion 2a and ferroelectric layer 5 are arranged on substrate portion SUB. Substrate portion SUB may be appropriately determined. Substrate portion SUB may be configured, for example, by a material that transmits an electromagnetic wave having a detection wavelength. Substrate portion SUB may be, for example, a readout circuit.

While electromagnetic wave detector 100 includes insulating film 3 in FIG. 33, electromagnetic wave detector 100 need not include insulating film 3. Also, two-dimensional material layer 1 may further be in contact with unillustrated another substrate portion. When two-dimensional material layer 1 is in contact with unillustrated another substrate portion, another substrate portion is preferably an insulating substance. When two-dimensional material layer 1 is not in contact with unillustrated another substrate portion, the material of insulating film 3 may be appropriately determined, and may be a semiconductor or the like.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 33, two-dimensional material layer 1, first electrode portion 2a, second electrode portion 2b and ferroelectric layer 5 are arranged on substrate portion SUB. Substrate portion SUB is configured, for example, by a material that transmits a detection wavelength. Therefore, an electromagnetic wave can enter ferroelectric layer 5 through substrate portion SUB from the substrate side. Thus, electromagnetic wave detector 100 is capable of detecting an electromagnetic wave entered ferroelectric layer 5 through substrate portion SUB from the substrate portion SUB side. That is, electromagnetic wave detector 100 is capable of operating by back illumination.

When substrate portion SUB is a readout circuit, electric connection between first electrode portion 2a and substrate portion SUB enables electromagnetic wave detector 100 to read out a detection signal.

Embodiment 15

Figure 34:
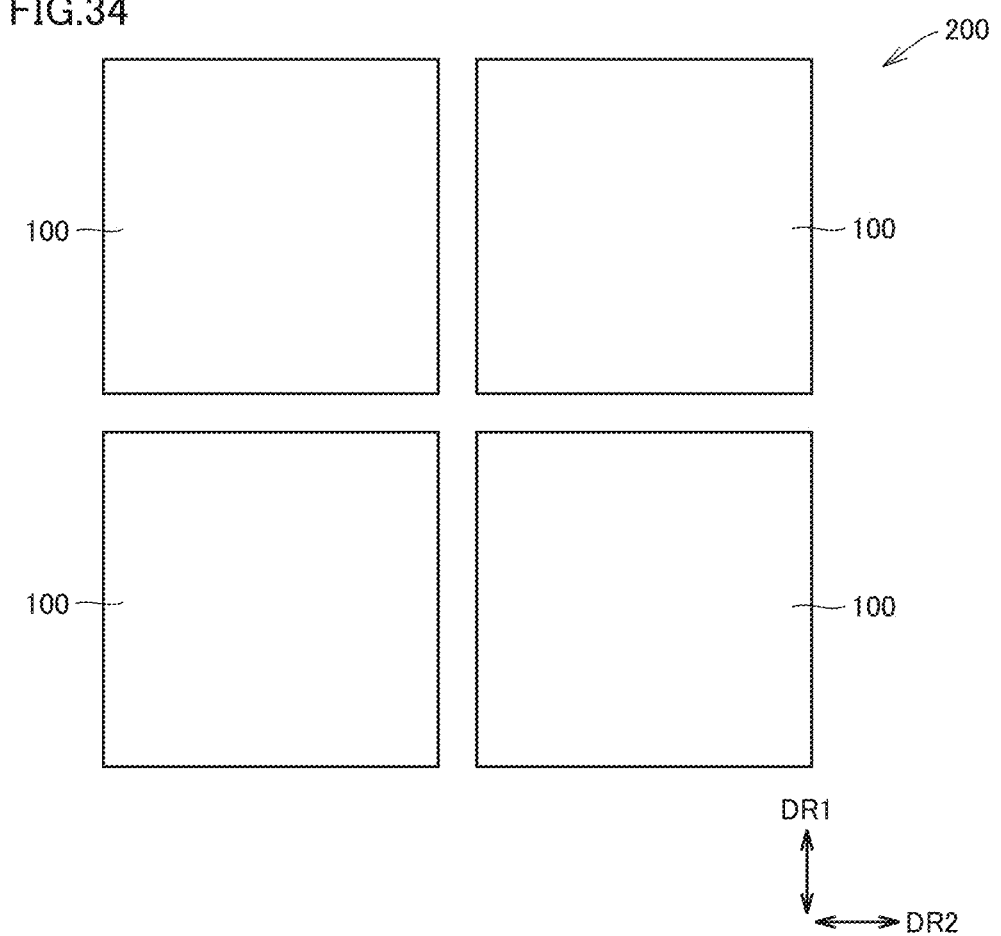
FIG. 34 is a top view schematically showing a configuration of an electromagnetic wave detector array according to Embodiment 15.

Next, by referring to FIG. 34, a configuration of an electromagnetic wave detector array 200 according to Embodiment 15 is described.

As shown in FIG. 34, electromagnetic wave detector array 200 according to the present embodiment has a plurality of electromagnetic wave detectors 100 according to Embodiments 1 to 14 and later-described Embodiments 16 to 18. The plurality of electromagnetic wave detectors 100 are arranged side by side along at least one of a first direction DR1 and a second direction DR2 intersecting first direction DR1. In the present embodiment, plurality of electromagnetic wave detectors 100 included in electromagnetic wave detector array 200 are electromagnetic wave detectors 100 that are the same with each other.

While four electromagnetic wave detectors 100 are arranged in a 2×2 array in electromagnetic wave detector array 200 shown in FIG. 34, the number of arranged electromagnetic wave detectors 100 is not limited to this. For example, nine electromagnetic wave detectors 100 may be arranged in a 3×3 array. In electromagnetic wave detector array 200 shown in FIG. 34, plurality of electromagnetic wave detectors 100 are arranged two-dimensionally and periodically, however, plurality of electromagnetic wave detectors 100 may be arranged periodically along one direction. Among plurality of electromagnetic wave detectors 100, intervals between neighboring electromagnetic wave detectors 100 may be equivalent or different from each other.

When respective semiconductor layers 4 (see FIG. 1) of plurality of electromagnetic wave detectors 100 are separated from each other, one second electrode portion 2b (see FIG. 1) may be used as a common electrode in plurality of electromagnetic wave detectors 100. Accordingly, it is possible to reduce the wiring of electromagnetic wave detector array 200 compared with the case where plurality of second electrode portions 2b are independent, and it is possible to enhance the resolution of electromagnetic wave detector array 200.

Figure 35:
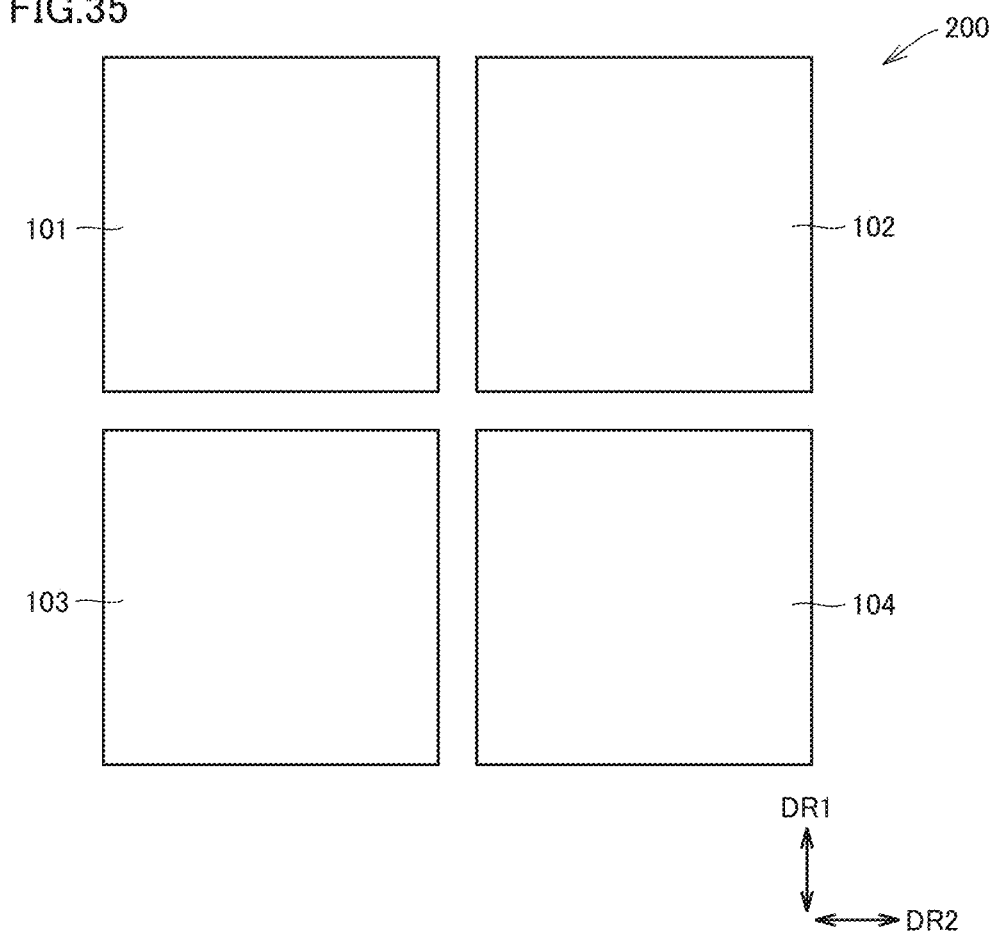
FIG. 35 is a top view schematically showing a configuration of an electromagnetic wave detector array according to a modified example of Embodiment 15.

Next, by referring to FIG. 35, a configuration of a modified example of electromagnetic wave detector array 200 according to Embodiment 15 is described.

As shown in FIG. 35, plurality of electromagnetic wave detectors included in electromagnetic wave detector array 200 are electromagnetic wave detectors 101 to 104 that are different from each other in kind. Electromagnetic wave detectors 101 to 104 that are different from each other are arranged in an array (in matrix). Plurality of electromagnetic wave detectors 101 to 104 may respectively have detection wavelengths that are different from each other. Specifically, plurality of electromagnetic wave detectors 101 to 104 may respectively have detection wavelength selectivities that are different from each other.

When materials that form respective semiconductor layer 4 or ferroelectric layer 5 (see FIG. 1) of plurality of electromagnetic wave detectors 101 to 104 have detection wavelengths that are different from each other, for example, a semiconductor material or a ferroelectric material of which detection wavelength is a wavelength of visible light, and a semiconductor material or a ferroelectric material of which detection wavelength is a wavelength of infrared light may be used. For example, when electromagnetic wave detector array 200 is applied to a vehicle-mounted sensor, electromagnetic wave detector array 200 can be used as a camera for visible light image during daytime. Further, electromagnetic wave detector army 200 can be used as an infrared camera during nighttime. With such a configuration, it is no longer necessary to use different cameras according to the detection wavelength of the electromagnetic wave.

Subsequently, operation and effect of the present embodiment is described.

According to electromagnetic wave detector array 200 according to the present embodiment, as shown in FIG. 34, electromagnetic wave detector array 200 has plurality of electromagnetic wave detectors 100 according to Embodiments 1 to 14. Therefore, by setting each of plurality of electromagnetic wave detectors 100 as a detection element, it is possible to make electromagnetic wave detector array 200 have a function as an image sensor.

According to a modified example of electromagnetic wave detector array 200 according to the present embodiment, as shown in FIG. 35, plurality of electromagnetic wave detectors 101 to 104 respectively have detection wavelengths that are different from each other. Therefore, electromagnetic wave detector array 200 is capable of detecting at least two or more electromagnetic waves having different wavelengths.

In this manner, electromagnetic wave detector array 200 is capable of discriminating wavelengths of electromagnetic waves in any wave ranges, for example, wave ranges of ultraviolet light, infrared light, terahertz wave, radio wave and the like in the same manner as an image sensor used in visible light range. As a result, it is possible to obtain, for example, a colored image in which difference in wavelength is shown as difference in color.

Also, electromagnetic wave detector array 200 may be used as a sensor other than an image sensor. Electromagnetic wave detector array 200 can be used, for example, as a position detecting sensor capable of detecting the position of an object even with a small number of pixels. Also, for example, electromagnetic wave detector array 200 can be used as an image sensor capable of detecting intensity of an electromagnetic wave at a plurality of wavelengths. Accordingly, it is possible to detect a plurality of electromagnetic waves and obtain a colored image without using a color filter that has been conventionally required in CMOS (complementary MOS) sensor or the like.

Plurality of electromagnetic wave detectors 101 to 104 are respectively configured to detect electromagnetic waves having polarizations that are different from each other. Accordingly, it is possible to make electromagnetic wave detector array 200 have a function as a polarization discriminating image sensor. For example, by arranging plurality of electromagnetic wave detectors 100 of one unit consisting of four pixels whose polarization angles are sensed are 0°, 90°, 45°, and 135°, polarization imaging is enabled. The polarization discriminating image sensor enables, for example, discrimination between artifact and natural object, discrimination of material, discrimination of plurality of objects having the same temperature in infrared wave range, discrimination of boundary between a plurality of objects, or improvement in equivalent resolution.

As described above, electromagnetic wave detector array 200 is capable of detecting electromagnetic waves of a broad wave range. Also, electromagnetic wave detector array 200 is capable of detecting electromagnetic waves of different wavelengths.

In each embodiment, as the material of at least one of insulating film 3, semiconductor layer 4 and contact layer 8, a material that provides two-dimensional material layer 1 with variation in potential due to change in characteristics by application of an electromagnetic wave may be used. For example, when the material that provides two-dimensional material layer 1 with variation in potential due to change in characteristics by application of an electromagnetic wave is used as a material of contact layer 8, contact layer 8 need not be in direct contact with two-dimensional material layer 1. For example, when contact layer 8 is capable of providing two-dimensional material layer 1 with variation in potential, contact layer 8 may be arranged on the top face or the bottom face of two-dimensional material layer 1 with insulating film 3 or the like interposed therebetween.

Examples of the material that provides two-dimensional material layer 1 with variation in potential due to change in characteristics by application of an electromagnetic wave include quantum dots, ferroelectric materials, liquid crystal materials, fullerenes, rare-earth oxides, semiconductor materials, pn-junction materials, metal-semiconductor junction materials, metal-insulator-semiconductor junction materials, and the like. For example, when a ferroelectric material having a polarization effect (pyroelectric effect) by an electromagnetic wave is used as the ferroelectric material, change in polarization occurs in the ferroelectric material by application of an electromagnetic wave. Thus, two-dimensional material layer 1 is provided with variation in potential.

Embodiment 16

Figure 36:
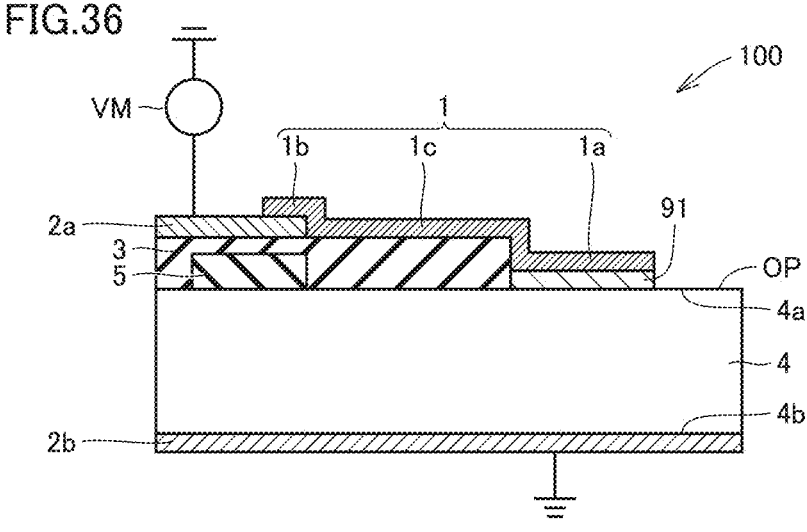
FIG. 36 is a section view schematically showing a configuration of an electromagnetic wave detector according to Embodiment 16.

Next, by referring to FIG. 36, a configuration of electromagnetic wave detector 100 according to Embodiment 16 is described. Unless otherwise described, Embodiment 16 has the same configuration and effect as above Embodiment 1. Therefore, the same configuration as that in Embodiment 1 is denoted by the same reference numeral, and description thereof is not repeated.

As shown in FIG. 36, electromagnetic wave detector 100 according to the present embodiment further includes a thin film dielectric layer 91. Thin film dielectric layer 91 is sandwiched between two-dimensional material layer 1 and semiconductor layer 4. Thin film dielectric layer 91 electrically connects first part 1a of two-dimensional material layer 1 and semiconductor layer 4. Therefore, first part 1a of two-dimensional material layer 1 is electrically connected to semiconductor layer 4 with thin film dielectric layer 91 interposed therebetween. Thin film dielectric layer 91 is arranged inside opening OP. Thin film dielectric layer 91 may be thinner than insulating film 3 and ferroelectric layer 5.

Thin film dielectric layer 91 is configured such that a current flows when an electromagnetic wave is applied. Thin film dielectric layer 91 has such a thickness that can generate a photo current between two-dimensional material layer 1 and semiconductor layer 4 when an electromagnetic wave having a detection wavelength is applied to two-dimensional material layer 1 and ferroelectric layer 5. Thin film dielectric layer 91 is configured such that photo current is generated when an electromagnetic wave having a detection wavelength is applied to two-dimensional material layer 1 and ferroelectric layer 5. Thin film dielectric layer 91 has a thickness of, for example, greater than or equal to 1 nm and less than or equal to 10 nm. It is desired that thin film dielectric layer 91 is configured such that polarization is generated in a dark state. It is desired that the material of thin film dielectric layer 91 is a material having such a polarizability that decreases a dark current by generation of polarization in a dark state.

Specific examples of the material of thin film dielectric layer 91 may be ferroelectric materials such as barium titanate ($BaTiO_3$), lithium niobate ($LiNbO_3$), lithium tantalate ($LiTaO_3$), strontium titanate ($SrTiO_3$), lead zirconate titanate (PZT), strontium bismuth tantalate (SBT), bismuth ferrite (BFO), zinc oxide (ZnO), hafnium oxide ($HfO_2$) and polyvinylidene fluoride ferroelectric substances that are organic polymers ((PVDF, P(VDF-TrFE), P(VDF-TrFE-CTFE) and so on) and the like. The material of thin film dielectric layer 91 may be a metal oxide such as alumina (aluminum oxide) or hafnium oxide ($HfO_2$), an oxide including a semiconductor such as silicon oxide (SiO) or silicon nitride ($Si_3N_4$), and a nitride such as boron nitride (BN). Also, the material of thin film dielectric layer 91 may be an organic polymer film such as carbon fluoride (CF) polymer film.

While the method for preparing thin film dielectric layer 91 may be appropriately determined, it can be selected, for example, from an ALD (Atomic Layer Deposition) method, a vacuum evaporation method, and a sputtering method. Thin film dielectric layer 91 may be formed by oxidizing or nitriding the surface of semiconductor layer 4. Thin film dielectric layer 91 may be a natural oxide film formed on the surface of semiconductor layer 4. Also, thin film dielectric layer 91 may be formed of a reaction product generated by reactive ion etching using carbon tetrafluoride ($CF_4$) or the like.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 36, thin film dielectric layer 91 is sandwiched between two-dimensional material layer 1 and semiconductor layer 4. Thin film dielectric layer 91 is configured such that a current flows when an electromagnetic wave is applied. Accordingly, a photo current is generated in electromagnetic wave detector 100 by incidence of electromagnetic wave. Therefore, the injection efficiency of photo current injected into two-dimensional material layer 1 through semiconductor layer 4 and thin film dielectric layer 91 improves. As a result, larger photo current is injected into two-dimensional material layer 1, as compared with the case without thin film dielectric layer 91. Therefore, the sensitivity of electromagnetic wave detector 100 improves.

Thin film dielectric layer 91 may be configured such that polarization is generated in a dark state. In this case, it is possible to suppress leakage current in the junction interface between two-dimensional material layer 1 and semiconductor layer 4. As a result, it is possible reduce the dark current.

Embodiment 17

Figure 37:
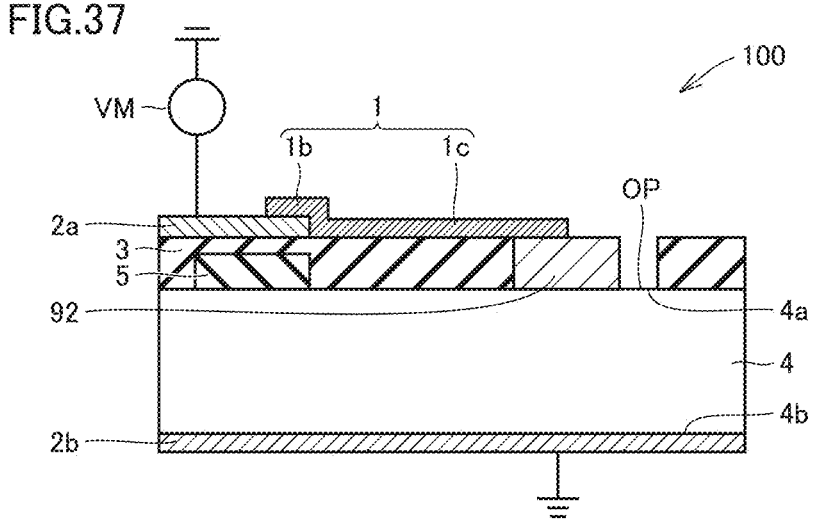
FIG. 37 is a section view schematically showing a configuration of an electromagnetic wave detector according to Embodiment 17.

Next, by referring to FIG. 37, a configuration of electromagnetic wave detector 100 according to Embodiment 17 is described. Embodiment 17 has the same configuration and operation and effect as Embodiment 1 unless otherwise described. Therefore, the same configuration as that in Embodiment 1 is denoted by the same reference numeral, and description thereof is not repeated.

As shown in FIG. 37, electromagnetic wave detector 100 according to the present embodiment further includes a thermoelectric material layer 92. Thermoelectric material layer 92 is sandwiched between two-dimensional material layer 1 and semiconductor layer 4. Two-dimensional material layer 1 is electrically connected to semiconductor layer 4 with thermoelectric material layer 92 interposed therebetween. Thermoelectric material layer 92 may be connected to two-dimensional material layer 1 and semiconductor layer 4 with an unillustrated electrode interposed therebetween. Thermoelectric material layer 92 is arranged inside opening OP. Thermoelectric material layer 92 may have the same thickness as insulating film 3.

On the top face of thermoelectric material layer 92, two-dimensional material layer 1 is overlaid. It is desired that the height position of the top face of thermoelectric material layer 92 is the same as the height position of the top face of insulating film 3. The bottom face of thermoelectric material layer 92 is electrically connected to first surface 4a of semiconductor layer 4.

Thermoelectric material layer 92 is configured such that a current flows when an electromagnetic wave is applied. Thermoelectric material layer 92 is configured such that voltage (thermal electromotive force) is generated when the temperature of thermoelectric material layer 92 varies. Thermoelectric material layer 92 is configured such that voltage is generated when the temperature of thermoelectric material layer 92 varies by application of electromagnetic wave. Thermoelectric material layer 92 is configured to generate the Seebeck effect. The Seebeck effect is the effect of generating electromotive force by temperature difference generated between both ends of two different kinds of metal or semiconductor that are mutually joined. Thermoelectric material layer 92 is configured to extract the thermal electromotive force generated by the temperature difference from two-dimensional material layer 1 and semiconductor layer 4.

Although not illustrated, for example, thermoelectric material layer 92 includes a p-type thermoelectric layer and an n-type thermoelectric layer. The p-type thermoelectric layer is, for example, a p-type bismuth telluride. The n-type thermoelectric layer is, for example, an n-type bismuth telluride. The p-type thermoelectric layer and the n-type thermoelectric layer are laminated. The p-type thermoelectric layer and the n-type thermoelectric layer are laminated along the direction in which two-dimensional material layer 1 and semiconductor layer 4 are laminated. By application of an electromagnetic wave toward one of the top face and the bottom face of thermoelectric material layer 92, the temperature of one of the top face and the bottom face of thermoelectric material layer 92 becomes relatively high, and the temperature of the other of the top face and the bottom face becomes relatively low. As a result, thermal voltage is generated from thermoelectric material layer 92. Therefore, a photo current when an electromagnetic wave is applied to electromagnetic wave detector 100 increases. Therefore, the sensitivity of electromagnetic wave detector 100 improves. Also, in a dark state, a dark current can be reduced by pn-junction barrier.

The material of thermoelectric material layer 92 may be appropriately determined as long as the material converts thermal energy generated by impartment of temperature difference, into electric energy. Examples of the material of thermoelectric material layer 92 include, p-type bismuth telluride, n-type bismuth telluride, a bismuth-tellurium-based thermoelectric semiconductor material, a telluride-based thermoelectric semiconductor material, an antimony-tellurium-based thermoelectric semiconductor material, a zinc-antimony-based thermoelectric semiconductor material, a silicon-germanium-based thermoelectric semiconductor material, a bismuth selenide-based thermoelectric semiconductor material, a silicide-based thermoelectric semiconductor material, an oxide-based thermoelectric semiconductor material, and a Heusler material. Examples of the bismuth-tellurium-based thermoelectric semiconductor material include bismuth telluride ($Bi_2Te_3$) and the like. Examples of the telluride-based thermoelectric semiconductor material include germanium telluride (GeTe) and lead telluride (PbTe) and the like. Examples of the zinc-antimony-based thermoelectric semiconductor material include zinc antimonides (ZnSb, $Zn_3Sb_2$ and $Zn_4Sb_3$) and the like. Examples of the silicon-germanium-based thermoelectric semiconductor material include silicon germanium (SiGe) and the like. Examples of the bismuth selenide-based thermoelectric semiconductor material include bismuth selenide (III) ($Bi_2Se_3$) and the like. Examples of the silicide-based thermoelectric semiconductor material includes iron silicide ($\beta$-$FeSi_2$), chromium silicide ($CrSi_2$), manganese silicide ($MnSi_{1.73}$), magnesium silicide ($Mg_2Si$) and the like. Examples of the Heusler material include FeVAl, FeVAlSi and FeVTiAl and the like. It is desired that the material of thermoelectric material layer 92 is any one of p-type bismuth telluride, n-type bismuth telluride, a bismuth-tellurium-based thermoelectric semiconductor material and a silicide-based thermoelectric semiconductor material. It is desired that the carrier of p-type bismuth telluride is a hole, the Seebeck coefficient of p-type bismuth telluride is a positive value, and configuration of p-type bismuth telluride is represented by $Bi_XTe_3Sb_2$—X ($0<X\leq0.6$). It is desired that the carrier of n-type bismuth telluride is an electron, the Seebeck coefficient of n-type bismuth telluride is a negative value, and configuration of n-type bismuth telluride is represented by $Bi_2Te_3$—$YSe_Y$ ($0<Y\leq3$). It is desired that the p-type bismuth telluride and n-type bismuth telluride are used as a pair. The p-type bismuth telluride and the n-type bismuth telluride may be used as a plurality of pairs that are connected with each other by serial connection. In this case, it is possible to increase the voltage generated by thermoelectric conversion, so that the sensitivity of electromagnetic wave detector 100 improves.

A method for depositing thermoelectric material layer 92 may be appropriately determined. Thermoelectric material layer 92 may be deposited, for example, by a known method such as an arc plasma evaporation method or a flash evaporation method.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIG. 37, thermoelectric material layer 92 is sandwiched between two-dimensional material layer 1 and semiconductor layer 4. Thermoelectric material layer 92 is configured such that a current flows when an electromagnetic wave is applied. Therefore, it is possible to improve the sensitivity of electromagnetic wave detector 100 by thermal electromotive force.

Also, since two or more kinds of thermoelectric materials (for example, p-type bismuth telluride and n-type bismuth telluride) are laminated, it is possible to suppress the dark current by the barrier of pn junction or the like.

The height position of the top face of thermoelectric material layer 92 may be the same as the height position of the top face of insulating film 3. In this case, two-dimensional material layer 1 can be formed linearly across the top face of thermoelectric material layer 92 and the top face of insulating film 3 without being bent. Therefore, two-dimensional material layer 1 may be formed horizontally without being bent. Therefore, the mobility of the photo carrier in two-dimensional material layer 1 improves.

Also, by making a lamination structure by combining thin film dielectric layer 91 shown in Embodiment 16 and thermoelectric material layer 92, it is possible to generate a larger voltage.

Embodiment 18

Figure 38:
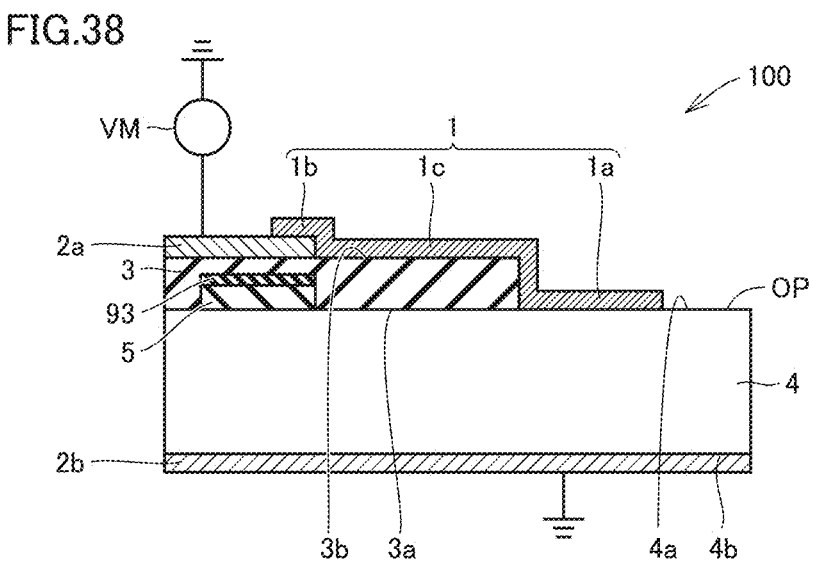
FIG. 38 is a section view schematically showing a configuration of an electromagnetic wave detector according to Embodiment 18.
Figure 39:
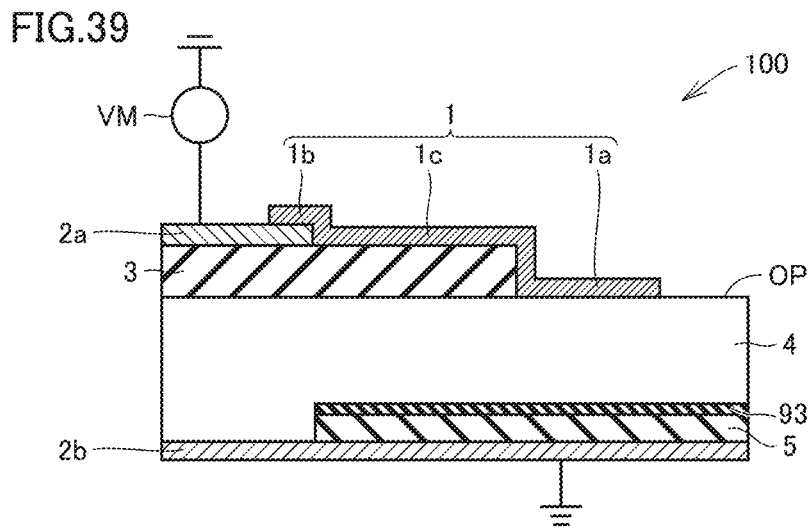
FIG. 39 is a section view schematically showing a configuration of an electromagnetic wave detector according to a first modified example of Embodiment 18.

Next, referring to FIGS. 38 and 39, a configuration of electromagnetic wave detector 100 according to Embodiment 18 is described. Unless otherwise described, Embodiment 18 has the same configuration and effect as above Embodiment 1. Therefore, the same configuration as that in Embodiment 1 is denoted by the same reference numeral, and description thereof is not repeated.

As shown in FIGS. 38 and 39, electromagnetic wave detector 100 according to the present embodiment further includes a heat generating material layer 93. Heat generating material layer 93 is arranged so as to be in contact with ferroelectric layer 5. The position where heat generating material layer 93 is in contact with ferroelectric layer 5 may be appropriately determined. Therefore, heat generating material layer 93 may be arranged in any of upper, lower, left, and right positions with respect to ferroelectric layer 5. It is desired that heat generating material layer 93 be arranged so as to be in contact with a surface on which an electromagnetic wave is applied (incident surface) of ferroelectric layer 5.

Heat generating material layer 93 is configured to generate heat when an electromagnetic wave is applied to heat generating material layer 93. That is, heat generating material layer 93 is configured to generate heat when an electromagnetic wave is applied to heat generating material layer 93. Since heat generating material layer 93 is in contact with ferroelectric layer 5, the heat generated when an electromagnetic wave is applied to heat generating material layer 93 is transmitted to ferroelectric layer 5 from heat generating material layer 93. Heat generating material layer 93 is configured to transmit the heat generated when an electromagnetic wave is applied to heat generating material layer 93, to ferroelectric layer 5. Heat generating material layer 93 has such a thickness that can generate heat when an electromagnetic wave having a detection wavelength is applied to ferroelectric layer 5. It is desired that heat generating material layer 93 is a material that absorbs an electromagnetic wave having a detection wavelength.

Specific examples of the material of heat generating material layer 93 include a black body material having a metal surface on which a black body paint is applied, graphite, multilayer graphene, a metal oxide such as alumina (aluminum oxide) or hafnium oxide ($HfO_2$), an oxide including a semiconductor such as silicon oxide (SiO) or silicon nitride ($Si_3N_4$), or a nitride such as boron nitride (BN). Also, the material of heat generating material layer 93 may be a plasmon absorber that utilizes surface plasmon resonance in which a metal pattern is periodically formed. Also, the material of heat generating material layer 93 may be a dielectric multilayer film, a nonreflective coat in which a nanoporous material is used, or an infrared absorbing material such as gold black.

The material of heat generating material layer 93 may be a thermoelectric material used in thermoelectric material layer 92 (see FIG. 37). Heat generating material layer 93 has a contact surface that comes into contact with ferroelectric layer 5. Heat generation of heat generating material layer 93 is transmitted to ferroelectric layer 5 via the contact surface. Heat generating material layer 93 configured by a thermoelectric material is configured to generate the Peltier effect by the current generated in ferroelectric layer 5. It is desired that heat generating material layer 93 configured by a thermoelectric material is configured to elevate the temperature of the contact surface by the Peltier effect.

A method for preparing heat generating material layer 93 may be appropriately determined, and can be selected from known deposition methods such as, for example, an ALD (Atomic Layer Deposition) method, a vacuum evaporation method, a sputtering method, an arc plasma evaporation method and a flash evaporation method and the like. Also, heat generating material layer 93 may be formed by oxidizing or nitriding the surface of semiconductor layer 4.

The configuration of electromagnetic wave detector 100 according to the present embodiment may be applied to other embodiments.

<Operation and Effect>

Subsequently, operation and effect of the present embodiment is described.

According to electromagnetic wave detector 100 according to the present embodiment, as shown in FIGS. 38 and 39, heat generating material layer 93 is arranged to be in contact with ferroelectric layer 5. Therefore, heat generating material layer 93 is capable of transmitting the heat generated by application of electromagnetic wave to ferroelectric layer 5. Therefore, polarization voltage of ferroelectric layer 5 generated by application of electromagnetic wave increases. Accordingly, the photo current of electromagnetic wave detector 100 increases. Therefore, the sensitivity of electromagnetic wave detector 100 improves.

It is desired that heat generating material layer 93 configured by a thermoelectric material is configured to elevate the temperature of the contact surface by the Peltier effect when an electromagnetic wave is applied. Therefore, the polarization change in ferroelectric layer 5 further increases by application of electromagnetic wave. Therefore, the photo current of electromagnetic wave detector 100 increases. Therefore, the sensitivity of electromagnetic wave detector 100 improves.

Also, by using in combination with a structure in which thin film dielectric layer 91 shown in Embodiment 16 or thermoelectric material layer 92 shown in Embodiment 17 is inserted between semiconductor layer 4 and two-dimensional material layer 1, it is possible to further improve the sensitivity of electromagnetic wave detector 100.

It is to be understood that the embodiments disclosed herein are illustrative, but are not restrictive in every respect. The scope of the present disclosure is indicated by the appended claims rather than by the description described above, and it is intended that all modifications within the equivalent meaning and scope of the claims are included.

REFERENCE SIGNS LIST

1: two-dimensional material layer, 1a: first part, 1b: second part, 2a: first electrode portion, 2b: second electrode portion, 3: insulating film, 4: semiconductor layer, 5: ferroelectric layer, 6: tunnel insulating layer, 7: conductor, 8: contact layer, 41: first semiconductor part, 42: second semiconductor part, 51: first ferroelectric part, 52: second ferroelectric part, 70: conductive part, 91: thin film dielectric layer, 92: thermoelectric material layer, 93: heat generating material layer, 100: electromagnetic wave detector, 200: electromagnetic wave detector array, CC: connection conductor, OP: opening

The invention claimed is:

1. An electromagnetic wave detector comprising:
a semiconductor layer;
a two-dimensional material layer electrically connected to the semiconductor layer;
a first electrode portion electrically connected to the two-dimensional material layer;
a second electrode portion electrically connected to the two-dimensional material layer with the semiconductor layer interposed between the second electrode portion and the two-dimensional material layer;
an insulating film that is arranged on the semiconductor layer, and is provided with an opening; and
a ferroelectric layer electrically connected to at least any one of the first electrode portion, the second electrode portion and the semiconductor layer,
the ferroelectric layer being arranged such that resistance between the first electrode portion and the second electrode portion changes when polarization inside the ferroelectric layer is changed by application of an electromagnetic wave, an electric field generated from the ferroelectric layer being shielded with respect to the two-dimensional material layer, a Fermi level of the two-dimensional material layer being configured so as not to be changed by an electric field effect of an electric field generated from the ferroelectric layer, or the ferroelectric layer being arranged so as not to be overlapped with the two-dimensional material layer in plan view, and
the two-dimensional material layer is electrically connected to the semiconductor layer in the opening, and extends from above the opening to the insulating film.

2. The electromagnetic wave detector according to claim 1, wherein
the first electrode portion has an annular shape in plan view,
the semiconductor layer is exposed from the insulating film on an inner side than the first electrode portion, and the two-dimensional material layer is electrically connected to the semiconductor layer on an inner side than the first electrode portion.

3. The electromagnetic wave detector according to claim 1, wherein a gap is provided between the insulating film and the two-dimensional material layer.

4. The electromagnetic wave detector according to claim 1, further comprising at least one of a voltmeter and an ammeter, wherein the two-dimensional material layer, the first electrode portion, the second electrode portion and the semiconductor layer are electrically connected in an order of the first electrode portion, the two-dimensional material layer, the semiconductor layer and the second electrode portion, and at least one of the voltmeter and the ammeter is configured to detect an electromagnetic wave by detecting change in at least one of voltage of a current and a current flowing between the first electrode portion and the second electrode portion.

5. The electromagnetic wave detector according to claim 1, further comprising a tunnel insulating layer, the tunnel insulating layer being sandwiched between the two-dimensional material layer and the semiconductor layer.

6. The electromagnetic wave detector according to claim 1, further comprising a connection conductor, wherein the two-dimensional material layer is electrically connected to the semiconductor layer with the connection conductor interposed between the two-dimensional material layer and the semiconductor layer.

7. The electromagnetic wave detector according to claim 1, wherein the two-dimensional material layer includes a plurality of first parts arranged on the semiconductor layer, and the plurality of first parts are arranged at an interval from each other.

8. The electromagnetic wave detector according to claim 1, wherein the two-dimensional material layer includes a plurality of second parts arranged on the first electrode portion, and the plurality of second parts are arranged at an interval from each other.

9. The electromagnetic wave detector according to claim 1, wherein the ferroelectric layer includes a first ferroelectric part and a second ferroelectric part, and each of the first ferroelectric part and the second ferroelectric part is electrically connected to the two-dimensional material layer and the semiconductor layer.

10. The electromagnetic wave detector according to claim 9, wherein a wavelength of electromagnetic wave capable of being absorbed by the first ferroelectric part is different from a wavelength of electromagnetic wave capable of being absorbed by the second ferroelectric part.

11. The electromagnetic wave detector according to claim 9, wherein a polarizability of the first ferroelectric part is different from a polarizability of the second ferroelectric part.

12. The electromagnetic wave detector according to claim 1, wherein the semiconductor layer includes a first semiconductor part and a second semiconductor part having a conductive type different from a conductive type of the first semiconductor part, and the first semiconductor part is joined with the second semiconductor part.

13. The electromagnetic wave detector according to claim 1, wherein the two-dimensional material layer includes a turbostratic structure part.

14. The electromagnetic wave detector according to claim 1, further comprising a contact layer, the contact layer being arranged to be in contact with the two-dimensional material layer.

15. The electromagnetic wave detector according to claim 1, further comprising a conductor, the conductor being arranged to be in contact with the two-dimensional material layer.

16. The electromagnetic wave detector according to claim 15, wherein the conductor includes a plurality of conductive parts, and the plurality of conductive parts are arranged at an interval from each other.

17. The electromagnetic wave detector according to claim 1, further comprising a substrate portion, wherein the two-dimensional material layer, the first electrode portion and the ferroelectric layer are arranged on the substrate portion.

18. An electromagnetic wave detector array comprising a plurality of the electromagnetic wave detectors according to claim 1, the plurality of electromagnetic wave detectors being arranged side by side along at least one of a first direction and a second direction intersecting the first direction.

19. The electromagnetic wave detector according to claim 1, wherein at least any one of the first electrode portion, the second electrode portion, and the semiconductor layer is sandwiched between the ferroelectric layer and the two-dimensional material layer.

20. The electromagnetic wave detector according to claim 1, wherein the two-dimensional material layer contacts a top surface of the semiconductor layer and a top surface of the first electrode portion.

21. The electromagnetic wave detector according to claim 1, wherein at least a portion of the second electrode is not overlapped by the ferroelectric layer in plan view.

22. The electromagnetic wave detector according to claim 1, further comprising:

an insulating film that is arranged on the semiconductor layer, wherein the two-dimensional material layer is in direct contact with the insulating film.

23. The electromagnetic wave detector according to claim 1 wherein the two-dimensional material layer is in direct contact with the semiconductor layer and the first electrode portion.

* * * * *